(12) United States Patent
Lee et al.

(10) Patent No.: US 11,366,015 B1
(45) Date of Patent: Jun. 21, 2022

(54) MICROELECTROMECHANICAL INFRARED SENSING DEVICE

(71) Applicant: Industrial Technology Research Institute, Hsinchu (TW)

(72) Inventors: Bor-Shiun Lee, New Taipei (TW); Ming-Fa Chen, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 17/240,077

(22) Filed: Apr. 26, 2021

(30) Foreign Application Priority Data

Dec. 21, 2020 (TW) ................................. 109145303

(51) Int. Cl.
*G01J 5/02* (2022.01)
*B81B 3/00* (2006.01)
*G01J 5/20* (2006.01)

(52) U.S. Cl.
CPC .......... *G01J 5/0215* (2013.01); *B81B 3/0029* (2013.01); *G01J 5/20* (2013.01); *B81B 2201/02* (2013.01)

(58) Field of Classification Search
CPC ......... G01J 5/0215; G01J 5/20; B81B 3/0029; B81B 2201/02
USPC ...................................................... 250/338.1
See application file for complete search history.

(56) References Cited

U.S. PATENT DOCUMENTS

| 6,712,480 B1* | 3/2004 | Leung | G02B 26/0816 359/224.1 |
| 6,908,201 B2* | 6/2005 | Gudeman | G02B 26/0808 359/884 |
| 7,750,301 B1 | 7/2010 | Woolaway et al. | |
| 7,968,846 B2 | 6/2011 | Talghader et al. | |

(Continued)

FOREIGN PATENT DOCUMENTS

| CN | 101249935 A | 8/2008 |
| CN | 106052883 A | 10/2016 |

(Continued)

OTHER PUBLICATIONS

Zerov et al. "Calculational modeling of the maincharacteristics of an uncooled linearmicrobolometer array" Mar. 2004, Optical Society of America.

(Continued)

*Primary Examiner* — David P Porta
*Assistant Examiner* — Gisselle M Gutierrez
(74) *Attorney, Agent, or Firm* — WPAT, PC

(57) ABSTRACT

A microelectromechanical infrared sensing device is provided, which includes a substrate, a sensing plate, a reflecting plate, a plurality of first supporting elements, a plurality of second supporting elements and a plurality of stoppers. The second supporting elements are connected to the sensing plate, such that the sensing plate is suspended above the substrate. The reflecting plate is disposed between the substrate and the sensing plate. The first supporting elements are connected to the reflecting plate, such that the reflecting plate is suspended between the substrate and the reflecting plate. When the reflecting plate moves toward the substrate and at least one of the stoppers contacts the substrate or the reflecting plate, the distance between the reflecting plate and the sensing plate increases.

19 Claims, 19 Drawing Sheets

(56) References Cited

U.S. PATENT DOCUMENTS

| | | | |
|---|---|---|---|
| 8,610,070 B2 * | 12/2013 | Schimert | G01J 5/08 250/353 |
| 9,417,134 B2 * | 8/2016 | Koechlin | H01L 27/14685 |
| 10,179,728 B2 | 1/2019 | Graybeal | |
| 2005/0017177 A1 | 1/2005 | Tai et al. | |
| 2010/0007936 A1 * | 1/2010 | Hornbeck | G02B 26/0841 359/224.1 |
| 2011/0321202 A1 * | 12/2011 | Kartik | G01Q 70/06 850/1 |
| 2014/0038336 A1 | 2/2014 | Tsuchiy | |
| 2016/0178444 A1 * | 6/2016 | Oulachgar | G01J 3/36 250/349 |
| 2016/0300952 A1 | 10/2016 | Toriumi et al. | |
| 2019/0004207 A1 * | 1/2019 | Wong | H01L 31/167 |
| 2020/0357925 A1 | 11/2020 | Toriumi et al. | |
| 2021/0190595 A1 | 6/2021 | Lee et al. | |

FOREIGN PATENT DOCUMENTS

| | | |
|---|---|---|
| TW | 536621 B | 6/2003 |
| TW | 200620642 | 6/2006 |
| TW | 201801189 A | 1/2018 |
| TW | 201808628 A | 3/2018 |
| TW | 201904085 A | 1/2019 |
| TW | 201921701 A | 6/2019 |
| TW | 202004309 A | 1/2020 |
| TW | 202040102 A | 11/2020 |

OTHER PUBLICATIONS

Niklaus et al. "Performance model for uncooled infraredbolometer arrays and performancepredictions of bolometers operating atatmospheric pressure", Aug. 2007, pp. 168-177, ScienceDirect.

"Resistive Bolometers" Apr. 12, 2021, http://www.spiedigitallibrary.org/ebooks/.

\* cited by examiner

MICROELECTROMECHANICAL INFRARED SENSING DEVICE

CROSS REFERENCE TO RELATED APPLICATION

All related applications are incorporated by reference. The present application is based on, and claims priority from, Taiwan Application Serial Number 109145303, filed on Dec. 21, 2020, the disclosure of which is hereby incorporated by reference herein in its entirety.

TECHNICAL FIELD

The technical field relates to microelectromechanical infrared sensing device with absorption rate active adjustment function.

BACKGROUND

Currently, the microelectromechanical infrared sensing devices have been successfully applied to various fields. So as to meet different requirements of various environments, the microelectromechanical infrared sensing devices need to support wider temperature range. Thus, the microelectromechanical infrared sensing devices must be able to automatically adjust the absorbing rates therefore according to different environmental temperatures.

However, a thermal insulation structure of a currently available microelectromechanical infrared sensing devices cannot effectively reduce the heat loss, so the performance of the microelectromechanical infrared sensing devices require further improvement.

Besides, since the distance between the infrared absorbing layer and the infrared reflecting layer of the currently available microelectromechanical infrared sensing device is fixed, a high-resolution readout circuit would go into saturation easily while being applied to read signals from the microelectromechanical infrared sensing device. Therefore, a limitation upon the sensing range of the microelectromechanical infrared sensing devices is thus inevitable.

Moreover, since the infrared absorbing layer of the currently available microelectromechanical infrared sensing device is sensitive to surrounding temperature, from which non-uniform thermal stress and corresponding thermal strain (mainly in bending) would occur to the microelectromechanical infrared sensing device. As a result, the distance between the infrared absorbing layer and the infrared reflecting layer may not be consistent, which significantly decreases the sensing accuracy of the microelectromechanical infrared sensing apparatus.

SUMMARY

An embodiment of the disclosure relates to a microelectromechanical infrared sensing device, comprising a substrate, a sensing plate, a reflecting plate and a plurality of first supporting elements, a plurality of second supporting elements and a plurality of stoppers. The second supporting elements are connected to the sensing plate, such that the sensing plate is suspended above the substrate. The reflecting plate is disposed between the substrate and the sensing plate. The first supporting elements are connected to the reflecting plate, such that the reflecting plate is suspended between the substrate and the reflecting plate. When the reflecting plate moves toward the substrate and at least one of the stoppers contacts the substrate or the reflecting plate, the distance between the reflecting plate and the sensing plate increases.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

FIG. 2 shows that the reflecting plate of the microelectromechanical infrared sensing device is at a first position.

FIG. 3 shows that the reflecting plate of the microelectromechanical infrared sensing device is at a second position.

DETAILED DESCRIPTION

Figure 1A:
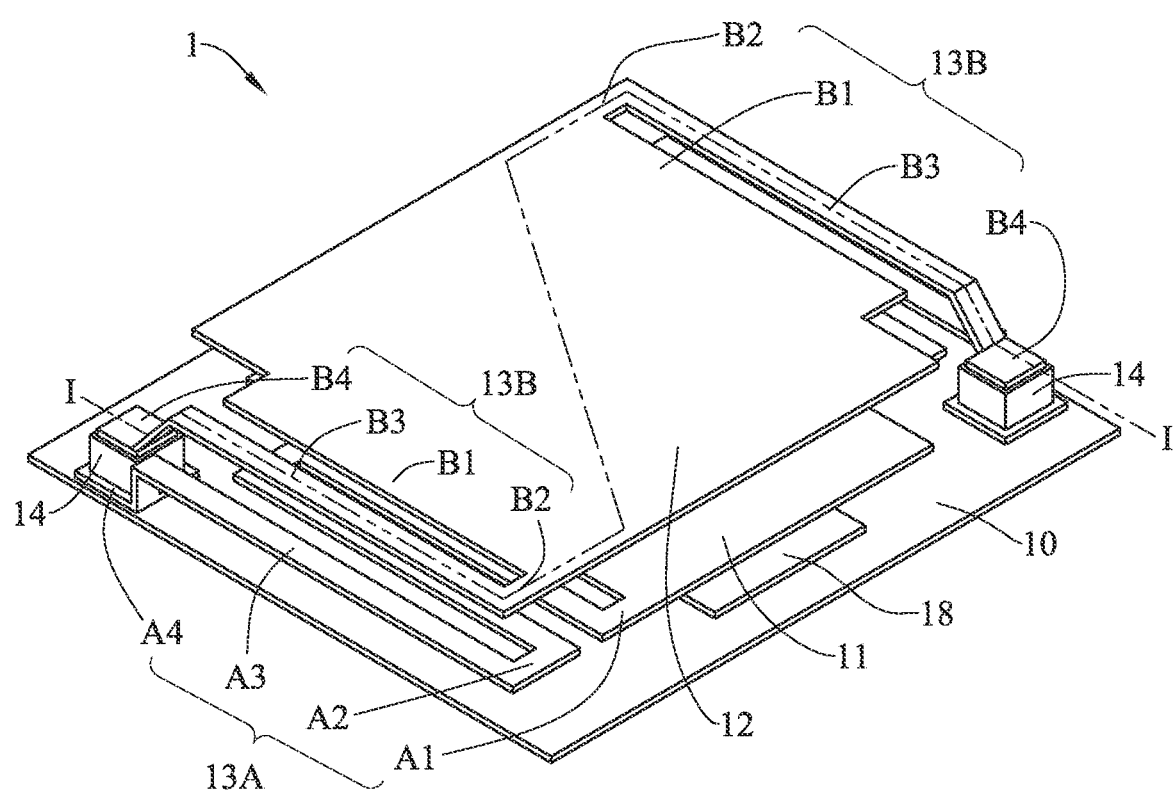
FIG. 1A~FIG. 1B are perspective views of a microelectromechanical infrared sensing device in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
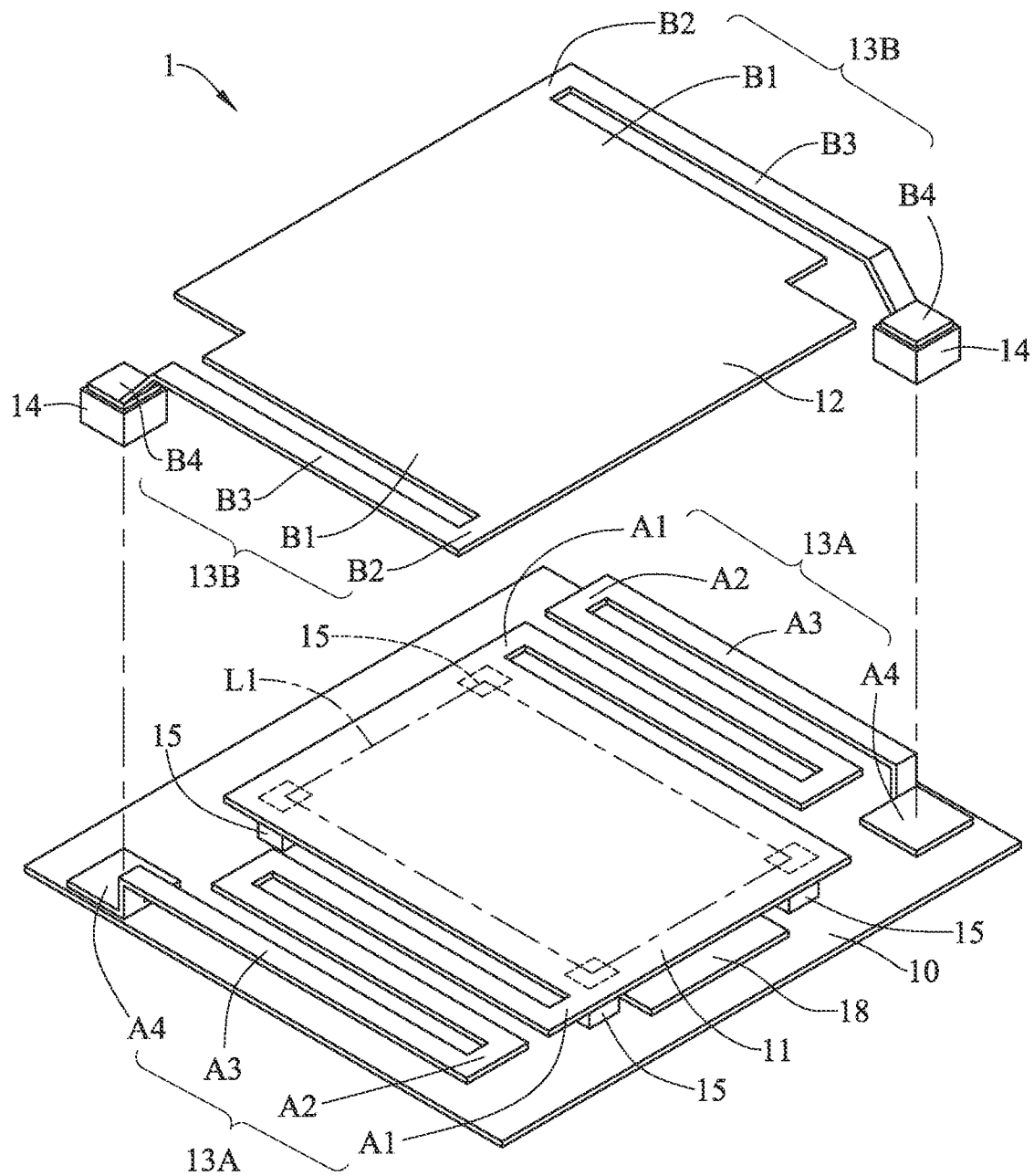

Please refer to FIG. 1A, FIG. 1B, FIG. 2 and FIG. 3, which are perspective views and cross-sectional views of a microelectromechanical infrared sensing device 1 in accordance with one embodiment of the disclosure respectively. As shown in FIG. 1A and FIG. 1B, the microelectromechanical infrared sensing device 1 includes a substrate 10, a reflecting plate 11, a sensing plate 12, a plurality of first supporting elements 13A, a plurality of second supporting elements 13B, a plurality of fixation bases 14, a plurality of stoppers 15, a voltage source 16, a controller 17 and an electrode layer 18.

The electrode layer 18 is disposed on the substrate 10. In one embodiment, the substrate 10 may be a silicon substrate or other similar components.

Each of the first supporting elements 13A includes a first connecting portion A1, a first bending portion A2, a first supporting portion A3 and a first anchor A4. The first connecting portion A1 is connected to the reflecting plate 11 and the first bending portion A2. The first supporting portion A3 is connected to the first bending portion A2 and the first anchor A4. One end of each of the first supporting elements 13A is fixed on the substrate 10 via the first anchor A4 and the other end thereof is connected to the reflecting plate 11 via the first connecting portion A1. Therefore, the reflecting plate 11 can be suspended above the substrate 10 via the first supporting elements 13A, such that a first thermal insulation chamber H1 is formed between the reflecting plate 11 and the substrate 10.

The fixation bases 14 are fixed on the first anchors A4 of the first supporting elements 13A respectively. Similarly, each of the second supporting elements 13B includes a second connecting portion B1, a second bending portion B2, a second supporting portion B3 and a second anchor B4. The second connecting portion B1 is connected to the sensing plate 12 and the second bending portion B2, and the second supporting portion B3 is connected to the second bending portion B2 and the second anchor B4. One end of each of the second supporting elements 13B is fixed on the corresponding fixation base 14 via the second anchor B4, and the other end thereof is connected to the sensing plate 12 via the second connecting portion B1. Accordingly, the sensing plate 12 can be suspended above the reflecting plate 11 via the second supporting elements 13B, such that a second thermal insulation chamber H2 is formed between the sensing plate 12 and the reflecting plate 11. The sensing plate 12 is fixed on the fixation bases 14 via the second supporting elements 13B; thus, although the distance between the reflecting plate 11 and the substrate 10 and the distance between the reflecting plate 11 and the sensing plate 12 may be changed, the sum of the two distances remains constant.

As described above, the microelectromechanical infrared sensing device 1 of the disclosure has a dual-layer structure. Namely, the reflecting plate 11 is suspended above the substrate 10 and the sensing plate 12. Accordingly, the space between the sensing plate 12 and the substrate 10 can be divided into two thermal insulation chambers (i.e. the first thermal insulation chamber H1 and the second thermal insulation chamber H2).

In the embodiment, the stoppers 15 are disposed on the lower surface of the reflecting plate 11, and between the substrate 10 and the reflecting plate 11. The stoppers 15 may be arranged on a basis of a central-symmetrical polygon. In other words, the line segments L1 connecting each of the two adjacent the stoppers 15 with each other form a central-symmetrical polygon. In the embodiment, the stoppers 15 are arranged on a basis of a rectangle; namely, the line segments L1 form, but not limited to, a rectangle. In another embodiment, the line segments L1 connecting each of the two adjacent the stoppers 15 can form a rhombus, a circle or other central-symmetrical polygons. In still another embodiment, the line segments L1 connecting each of the two adjacent the stoppers 15 can form a triangle, a pentagon, a hexagon, other axial symmetrical polygons or irregular shapes. In the embodiment, the stoppers 15 have the same height.

The voltage source 16 is electrically connected to the electrode layer 18 on the substrate 10 and the reflecting plate 11. The controller 17 is electrically connected to the voltage source 16 and controls the voltage source 16 to output a voltage so as to form a voltage difference between the electrode layer 18 and the reflecting plate 11 and then control the reflecting plate 11 to move via the voltage difference. In one embodiment, the controller 17 may be a microcontroller unit (MCU), a central processing unit (CPU), an application-specific integrated circuit (ASIC) or other similar components.

Figure 2:
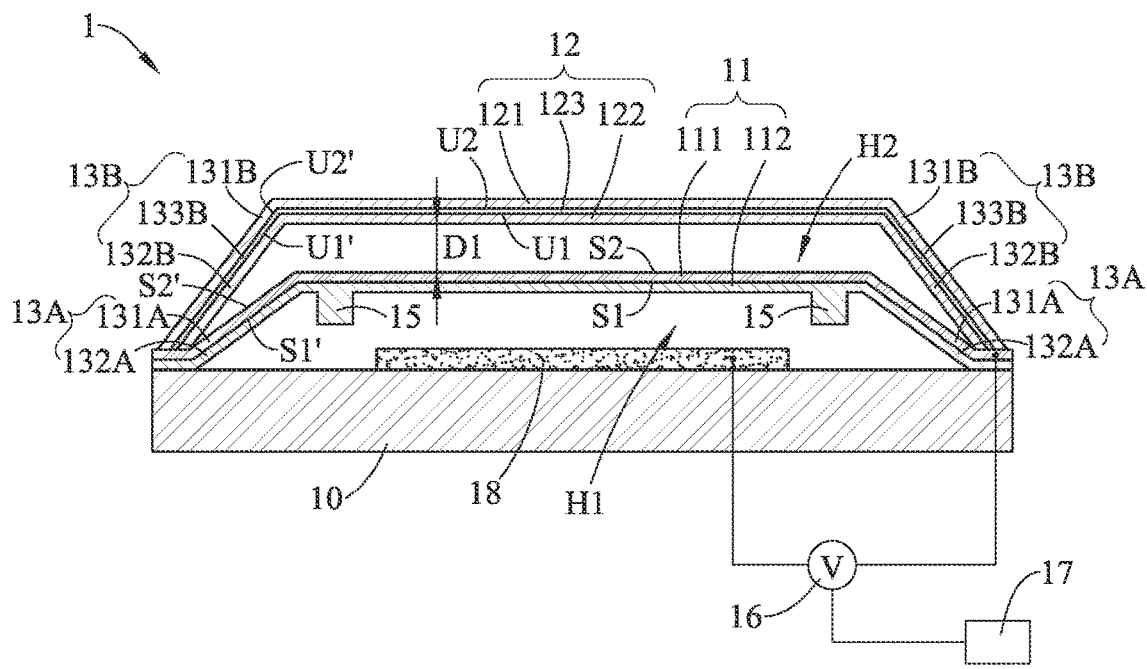
FIG. 2 is a cross-sectional view of the microelectromechanical infrared sensing device in accordance with one embodiment of the disclosure.

FIG. 2 is the cross-sectional view of the microelectromechanical infrared sensing device 1 along the section line I-I in FIG. 1A. As shown in FIG. 2, the reflecting plate 11 includes an infrared reflecting layer 111 and a dielectric material layer 112. The infrared reflecting layer 111 of the reflecting plate 11 includes a lower surface S1 facing the substrate 10 and an upper surface S2 opposite to the lower surface S1. The dielectric material layer 112 of the reflecting plate 11 is disposed on the lower surface S1 of the infrared reflecting layer 111. Besides, the voltage source 16 is electrically connected to the electrode layer 18 of the substrate 10 and the infrared reflecting layer 111 of the reflecting plate 11. In one embodiment, the infrared reflecting layer 111 of the reflecting plate 11 may be a metal layer having high reflecting rate, such as Al, Au, Ag, W, Cu, Ti, Ta, or Mo, etc., such that the infrared reflecting layer 111 may serve as another electrode layer corresponding to the electrode layer 18. In one embodiment, the dielectric material layer 112 of the reflecting plate 11 may be made of a dielectric material, such as $SiN_x$, $SiO_x$, or $SiO_xN_y$, etc., so as to provide the insulation effect. The stoppers 15 and the dielectric material layer 112 of the reflecting plate 11 may be made of the same material.

Similarly, each of the first supporting elements 13A also includes an infrared reflecting layer 131A and a dielectric material layer 132A. The infrared reflecting layer 131A of each of the first supporting elements 13A includes a lower surface S1' adjacent to the substrate 10 and an upper surface S2' opposite to the lower surface S1'. Besides, the dielectric material layer 132A of each of the first support elements 13A is disposed on the lower surface S1' of the infrared reflecting layer 131A thereof.

The sensing plate 12 includes an upper infrared absorbing layer 121, an infrared sensing layer 123 and a lower infrared absorbing layer 122. The infrared sensing layer 123 comprises a lower surface U1 facing the substrate 10 and an upper surface U2 opposite to the lower surface U1. The upper infrared absorbing layer 121 of the sensing plate 12 is disposed on the upper surface U2 of the infrared sensing layer 123 and the lower infrared absorbing layer 122 of the sensing plate 12 is disposed on the lower surface U1 of the infrared sensing layer 123, such that the infrared sensing layer 123 of the sensing plate 12 is between the upper infrared absorbing layer 121 and the lower infrared absorbing layer 122. In the embodiment, the sensing plate 12 is a symmetrical structure. Namely, the upper infrared absorbing layer 121 and the lower infrared absorbing layer 122 of the sensing plate 12 may be made of the same material. In addition, the thickness of the upper infrared absorbing layer 121 may be substantially equal to the thickness of the lower infrared absorbing layer 122. In one embodiment, the upper infrared absorbing layer 121 and the lower infrared absorbing layer 122 of the sensing plate 12 may be made of a dielectric material, such as $SiN_x$, $SiO_x$, or $SiO_xN_y$, etc. In one embodiment, the infrared sensing layer 123 of the sensing plate 12 may be an alloy layer, a metal compound layer, a metal oxide layer, a silicon compound layer, or a silicon layer, etc., such as SiGe, $VO_x$, p-Si, a-Si, or Ti-silicide, etc. Since the upper infrared absorbing layer 121 and the lower infrared absorbing layer 122 of the sensing plate 12 may be made of the same material, and the thickness of the upper infrared absorbing layer 121 may be substantially equal to the thickness of the lower infrared absorbing layer 122, these layers have the same material properties, structure and size. The aforementioned material properties may be coefficient of thermal expansion, Young's Modulus, etc. Accordingly, the symmetric structure of the sensing plate 12 can achieve stress balance, which can prevent from warpage and deformation during the manufacturing process of the sensing plate 12. For the same reason, when the thickness and material of the upper infrared absorbing layer 121 are the same with those of the lower infrared absorbing layer 122, the complexity and cost of the manufacturing process of the sensing plate 12 can be obviously decreased. In another embodiment, the sensing plate may have an unsymmetrical structure and not be limited to symmetrical structure.

Similarly, each of the second supporting elements 13B includes a lower infrared absorbing layer 132B adjacent to the substrate 10, an infrared sensing layer 133B and an upper infrared absorbing layer 131B. The infrared sensing layer 133B of the second supporting element 13B includes a lower surface U1' adjacent to the substrate 10 and an upper surface U2' opposite to the lower surface U1'. The upper infrared absorbing layer 131B of the second supporting element 13B is disposed on the upper surface U2' of the infrared sensing layer 133B and the lower infrared absorbing layer 132B of the infrared sensing layer 133B is disposed on the lower surface U1' of the infrared sensing layer 133B, such that the infrared sensing layer 133B of the second supporting element 13B is between the upper infrared absorbing layer 131B and the lower infrared absorbing layer 132B. Each of the second supporting elements 13B may also have a symmetrical structure. That is to say, the upper infrared absorbing layer 131B and the lower infrared absorbing layer 132B of the second supporting element 13B may be made of the same material. In addition, the thickness of the upper infrared absorbing layer 131B may be substantially equal to the thickness of the lower infrared absorbing layer 132B. Since the upper infrared absorbing layer 131B and the lower infrared absorbing layer 132B of the second supporting element 13B may be made of the same material, and the thickness of the upper infrared absorbing layer 131B may be substantially equal to the thickness of the lower infrared absorbing layer 132B, these layers have the same material properties, structure and size. Accordingly, the second supporting elements 13B can have low thermal stress and low warpage during the manufacturing process. When the upper infrared absorbing layer 131B and the lower infrared absorbing layer 132B of the second supporting element 13B are made of the same material and have the same thickness, the second supporting elements 13B and the sensing plate 12 can be manufactured by the same manufacturing process. Therefore, the complexity and cost of the manufacturing process of the microelectromechanical infrared sensing device 1 can be greatly decreased.

The sensing plate 12 can change the resistance thereof after absorbing the radiant energy of the incoming infrared light and the reflecting plate 11 can reflect the infrared light not absorbed by the sensing plate 12 to the sensing plate 12, such that the sensing plate 12 can absorb the radiant energy of the reflected infrared light again. When the controller 17 controls the voltage source 16 to generate a voltage difference between the electrode layer 18 of the substrate 10 and the infrared reflecting layer 111 of the reflecting plate 11, the voltage difference can change the electrostatic force between the electrode layer 18 and the reflecting plate 11, thus the reflecting plate 11 can move toward the substrate 10. Accordingly, the distance between the reflecting plate 11 and the sensing plate 12 is changed. Such a mechanism can vary the absorbing rate of the sensing plate 12 so as to avoid possible saturation in the readout circuit. Thereupon, the sensing range of the microelectromechanical infrared sensing device 1 can be effectively expanded.

As shown in FIG. 2, when the controller 17 does not turn on the voltage source 16, the reflecting plate 11 is at the position closest to the sensing plate 12; in other words, the reflecting plate 12 is at the first position, as shown in FIG. 2. When the reflecting plate 11 is at the first position, the distance between the reflecting plate 11 and the sensing plate 12 is first distance D1, and the microelectromechanical infrared sensing device 1 operates in a first absorbing rate mode.

Figure 3:
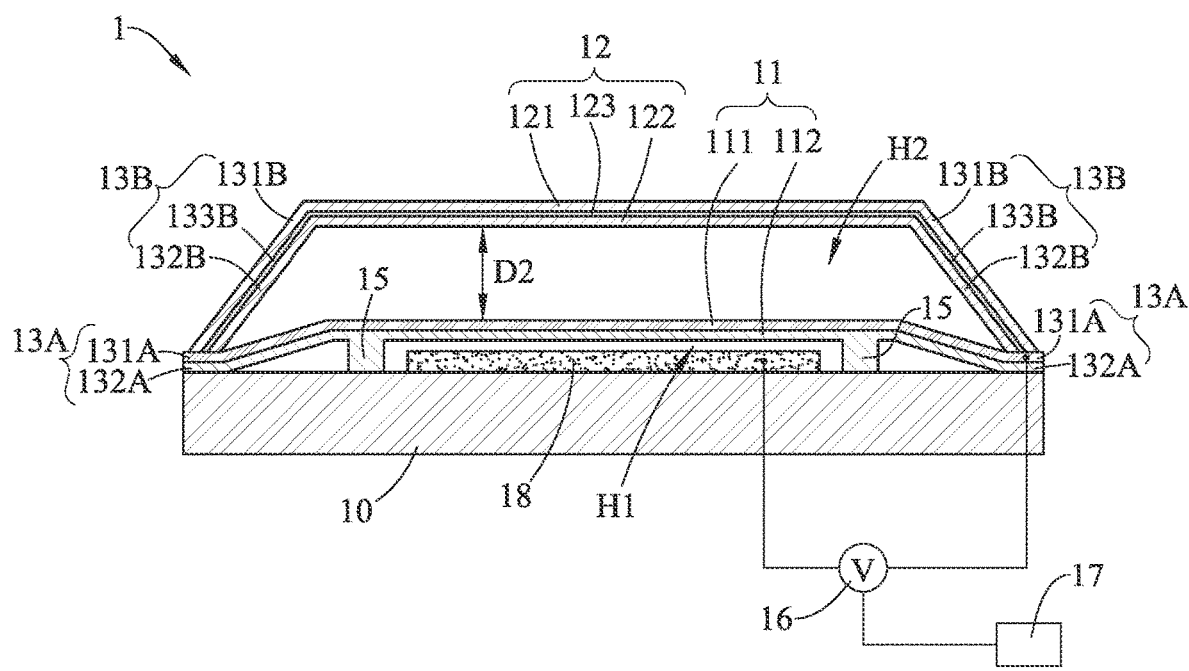
FIG. 3 is another cross-sectional view of the microelectromechanical infrared sensing device in accordance with one embodiment of the disclosure.

As shown in FIG. 3, when the temperature (hereinafter "target temperature") of the sensing target of the microelectromechanical infrared sensing device 1 changes to be T1, the controller 17 turns on the voltage source 16 to generate a first control voltage V1 so as to control the reflecting plate 11 to move, from the first position (as shown in FIG. 2) away from the substrate 10, toward the substrate 10. When the stoppers 15 contact the substrate 10, the reflecting plate 11 stops moving and stays at the second position, as shown in FIG. 3. When the reflecting plate 11 is at the second position, the distance between the reflecting plate 11 and the sensing plate 12 is second distance D2. Meanwhile, when the stoppers 15 are sandwiched between the substrate 10 and the reflecting plate 11, and press against the substrate 10 and the reflecting plate 11. The second distance D2 of the second position is greater than the first distance D1 of the first position. When the reflecting plate 11 is at the second position, the distance between the reflecting plate 11 and the substrate 10 is substantially equal to the height of the stoppers 15. Thus, the reflecting plate 11 would not contact the electrode layer 18, and the distance between the sensing plate 12 and the reflecting plate 11 is maximized. At this moment, the microelectromechanical infrared sensing device 1 operates in a second absorbing rate mode.

When the target temperature of the microelectromechanical infrared sensing device 1 changes to be T2 (T2>T1), the controller 17 turns off the voltage source 16 (i.e. the voltage source 16 is in off state) so as to control the reflecting plate 11 to move in the direction away from the substrate 10 and then stop after the reflecting plate 11 returns back at the first position; that is to say, the microelectromechanical infrared sensing device 1 returns back to the state that the distance between the reflecting plate 11 and the sensing plate 12 is first distance D1. At this moment, the reflecting plate 11 is at the first position, as shown in FIG. 2, and the microelectromechanical infrared sensing device 1 operates in the first absorbing rate mode so as to prevent the readout circuit from saturation. In this way, the microelectromechanical infrared sensing device 1 can obtain accurate sensing results. As described above, the absorbing rate of the microelectromechanical infrared sensing device 1 can be adjusted by changing the position of the reflecting plate 11 in order to increase the sensing range thereof.

This embodiment is just for illustration; the relation between the height of the reflecting plate 11 and the absorbing rate can be changed by modifying the structural design of the microelectromechanical infrared sensing device 1. In other words, the height of the reflecting plate 11 may be proportional to or inversely proportional to the absorbing rate. More specifically, when the reflecting plate 11 descends from the highest positon to the lowest position, the microelectromechanical infrared sensing device 1 changes from the low absorbing rate mode to the high absorbing rate mode. In another embodiment, when the reflecting plate 11 descends from the highest positon to the lowest position, the microelectromechanical infrared sensing device 1 changes from the high absorbing rate mode to the low absorbing rate mode.

As set forth above, when the target temperature of the microelectromechanical infrared sensing device 1 is high, the microelectromechanical infrared sensing device 1 can be switched to the first absorbing rate mode by adjusting the voltage outputted by the voltage source 16. On the contrary, when the target temperature of the microelectromechanical infrared sensing device 1 is low, the microelectromechanical infrared sensing device 1 can be also switched to the second absorbing rate mode by adjusting the voltage outputted by the voltage source 16. In this way, the microelectromechanical infrared sensing device 1 can have multiple operating points P1 and P2, such that the total thermal power absorbed by the microelectromechanical infrared sensing device 1 can be always lower than a designated value in order to prevent from the saturation of the high-resolution readout circuit.

Moreover, the first thermal insulation chamber H1(between the reflecting plate 11 and the substrate 10) and the second thermal insulation chamber H2 (between the sensing plate 12 and the reflecting plate 11) can effectively enhance the thermal insulation effect and reduce heat loss no matter what the operating mode of the microelectromechanical infrared sensing device 1 is. Therefore, the above dual-layer structure can effectively improve the performance of the microelectromechanical infrared sensing device 1.

Figure 4A:
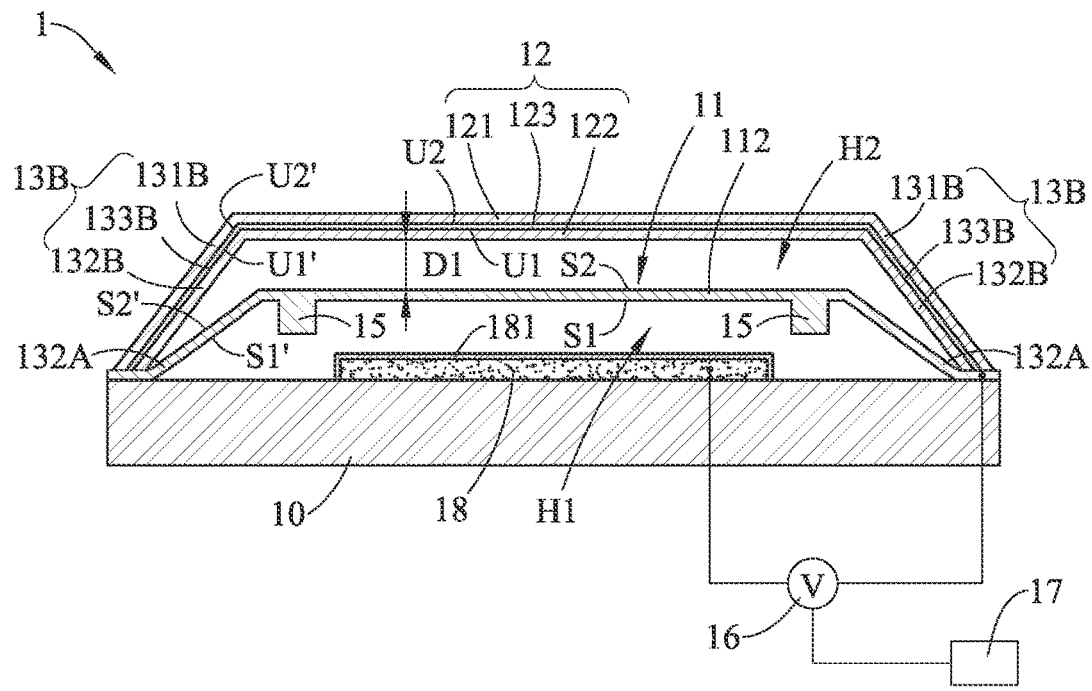
FIG. 4A~FIG. 4B are cross-sectional views of the microelectromechanical infrared sensing device in accordance with one embodiment of the disclosure.

Please refer to FIG. 4A, which is a cross-sectional view of the microelectromechanical infrared sensing device 1 in accordance with one embodiment of the disclosure. The difference between this embodiment and the embodiment of FIG. 2 and FIG. 3 is that the reflecting plate 11 of this embodiment as FIG. 4A has only the infrared reflecting layer 111 and the stoppers 15 are disposed on the lower surface S1 of the infrared reflecting layer 111. The infrared reflecting layer 111 of the reflecting plate 11 and the stoppers 15 may be made of the metals with high reflecting rate, such as Al, Au, Ag, W, Gu, Ti, Ta, or Mo, etc. As the reflecting plate 11 has only the infrared reflecting layer 111, the electrode layer 18 disposed on the substrate 10 needs to be provided with an insulation layer 181.

Figure 4B:
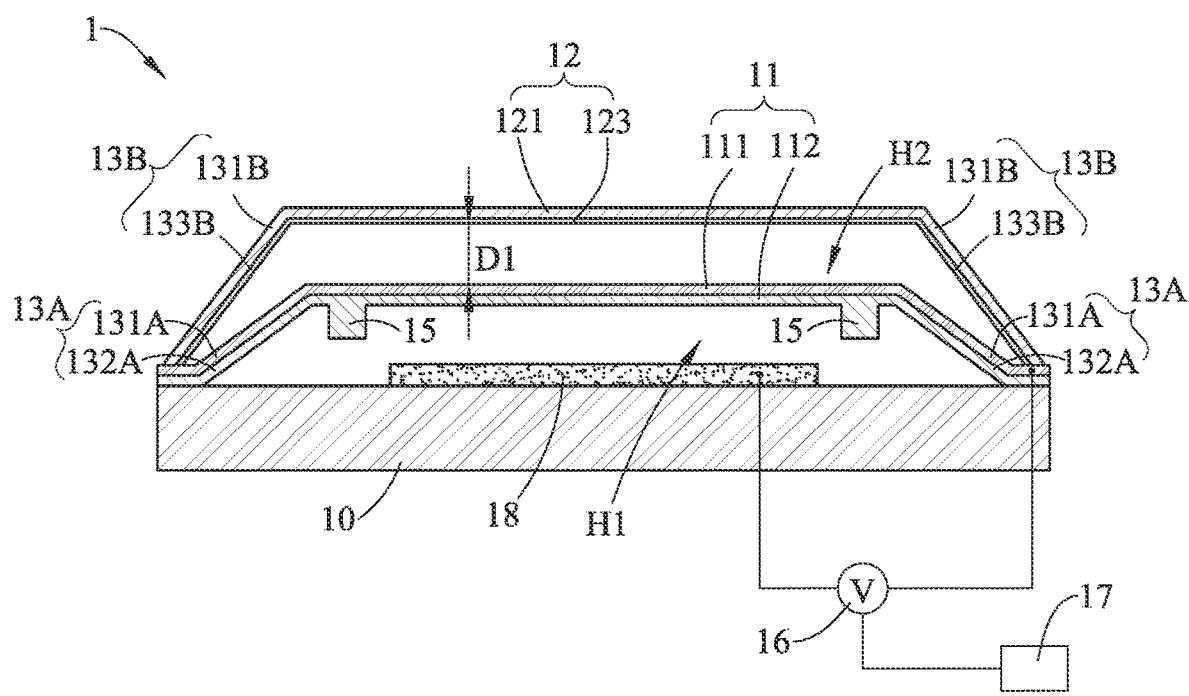

Please refer to FIG. 4B, which is a cross-sectional view of the microelectromechanical infrared sensing device 1 in accordance with one embodiment of the disclosure. The difference between this embodiment and the embodiment of FIG. 2 and FIG. 3 is that the sensing plate 12 of this embodiment has only the upper infrared absorbing layer 121 and the infrared sensing layer 123. Therefore, the sensing plate 12 of this embodiment is a plate having a dual-layer structure consisting of the upper infrared absorbing layer 121 and the infrared sensing layer 123. Compared with the sensing plate of the triple-layer structure, the absorbing rate of the sensing plate 12 of this embodiment may be lower, but the sensing plate 12 of this embodiment can still have the function of absorbing and sensing infrared light.

Figure 5:
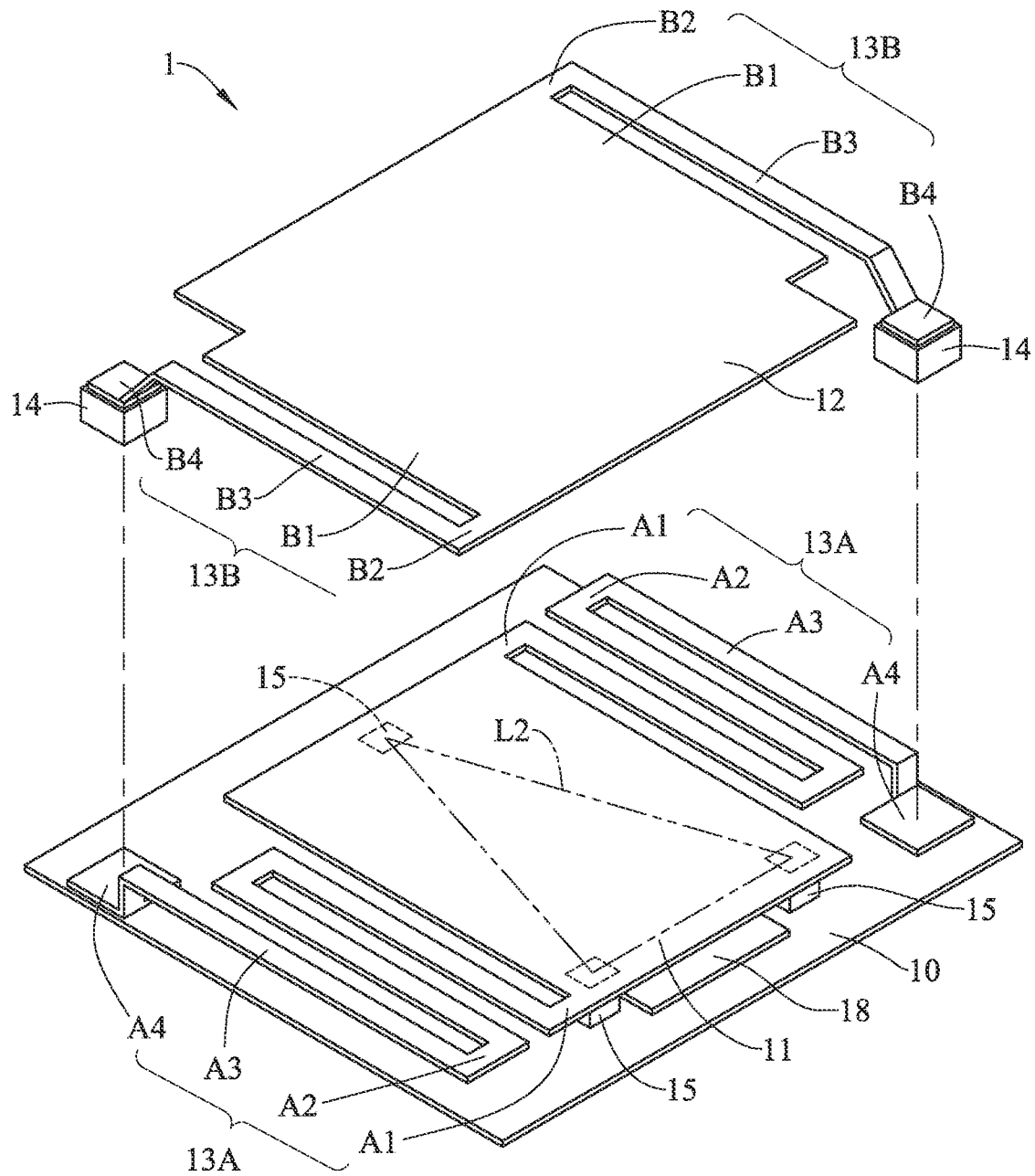
FIG. 5 is a perspective view of a microelectromechanical infrared sensing device in accordance with one embodiment of the disclosure.

Please refer to FIG. 5, which is a perspective view of a microelectromechanical infrared sensing device 1 in accordance with one embodiment of the disclosure. As shown in FIG. 5, the stoppers 15 of the embodiment are disposed on the lower surface of the reflecting plate 11 and the line segments L2 connecting each of the two adjacent the stoppers 15 can form a triangle.

Figure 6:
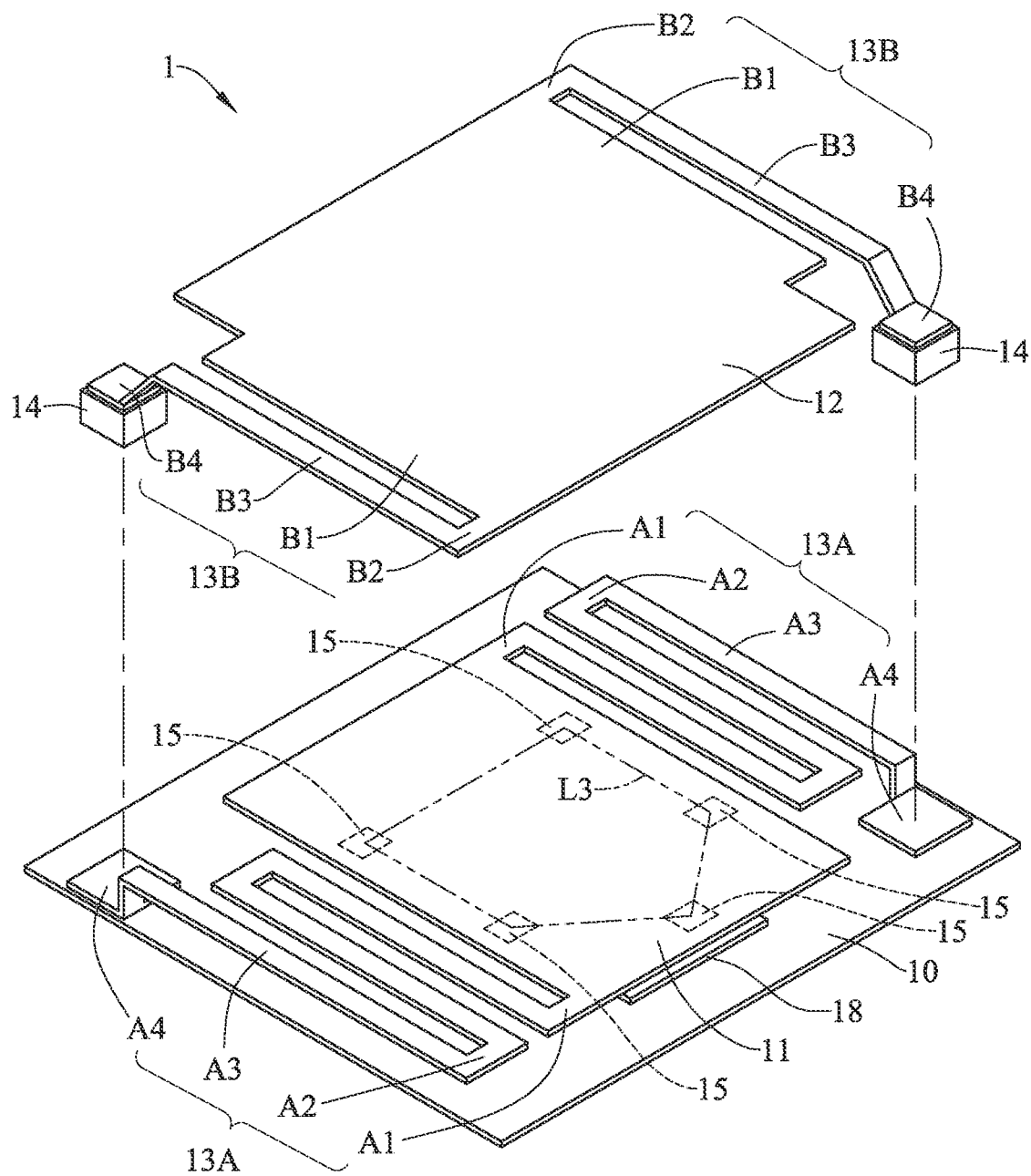
FIG. 6 is a perspective view of a microelectromechanical infrared sensing device in accordance with one embodiment of the disclosure.

Please refer to FIG. 6, which is a perspective view of a microelectromechanical infrared sensing device 1 in accordance with one embodiment of the disclosure. As shown in FIG. 6, the stoppers 15 of the embodiment are disposed on the lower surface of the reflecting plate 11 and the line segments L3 connecting each of the two adjacent the stoppers 15 can form a pentagon.

Figure 7:
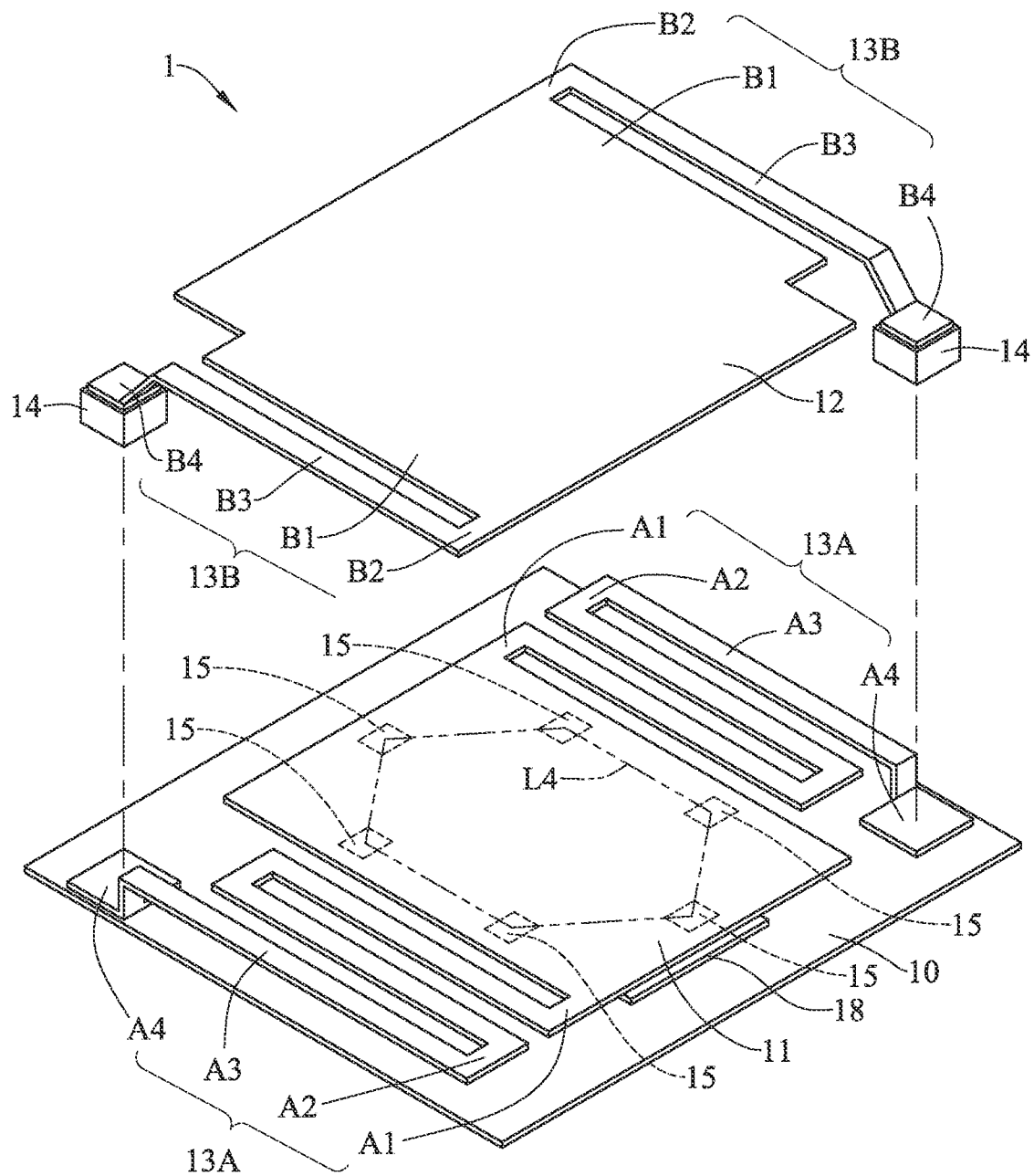
FIG. 7 is a perspective view of a microelectromechanical infrared sensing device in accordance with one embodiment of the disclosure.

Please refer to FIG. 7, which is a perspective view of a microelectromechanical infrared sensing device 1 in accordance with one embodiment of the disclosure. As shown in FIG. 7, the stoppers 15 of the embodiment are disposed on the lower surface of the reflecting plate 11 and the line segments L4 connecting each of the two adjacent the stoppers 15 can form a hexagon.

Figure 8:
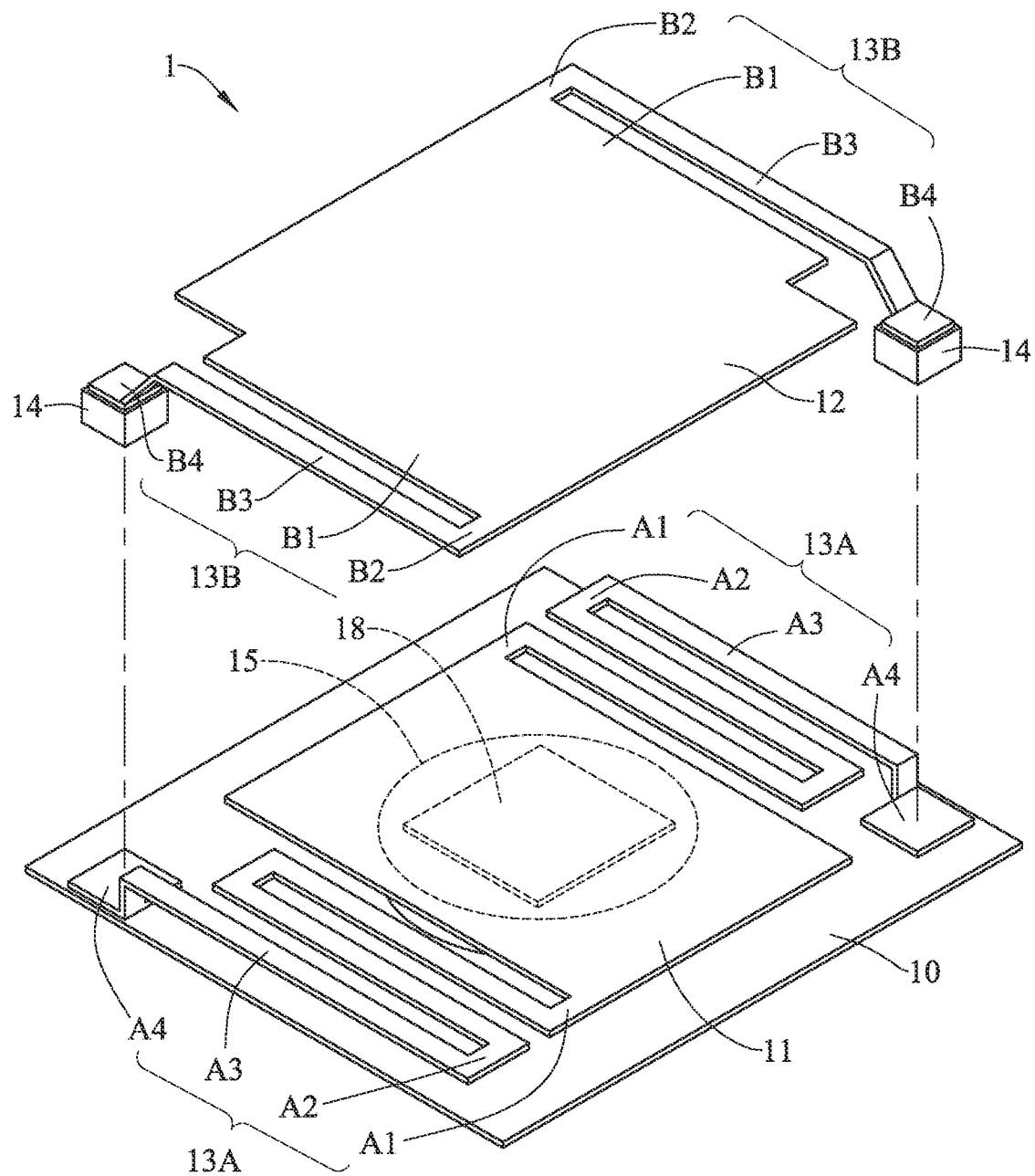
FIG. 8 is a perspective view of a microelectromechanical infrared sensing device in accordance with one embodiment of the disclosure.

Please refer to FIG. 8, which is a perspective view of a microelectromechanical infrared sensing device 1 in accordance with one embodiment of the disclosure. As shown in FIG. 8, the microelectromechanical infrared sensing device 1 of this embodiment has only one stopper 15 disposed on the lower surface of the reflecting plate 11; the stopper 15 may be, but not limited to, a circular ring. In another embodiment, the stopper 15 may be a rectangular ring or a ring in a different shape.

Figure 9:
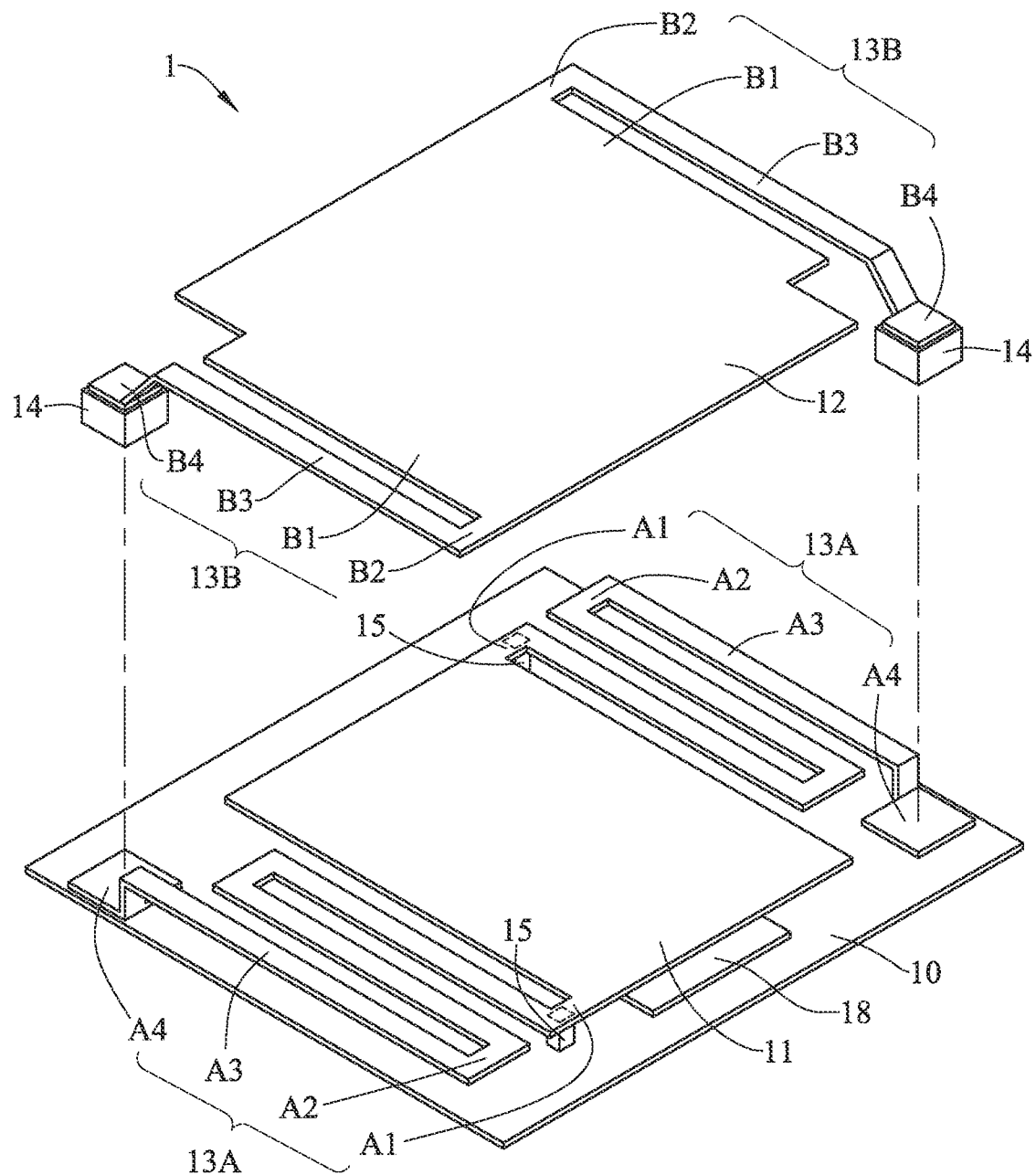
FIG. 9 is a perspective view of a microelectromechanical infrared sensing device in accordance with one embodiment of the disclosure.

Please refer to FIG. 9, which is a perspective view of a microelectromechanical infrared sensing device 1 in accordance with one embodiment of the disclosure. As shown in FIG. 9, each of the stoppers 15 of this embodiment is disposed on one end of the first connecting portion A1 of the corresponding first supporting element 13A. When the controller 17 does not turn on the voltage source 16, the reflecting plate 11 is at the first position; in this case, the distance between the reflecting plate 11 and the sensing plate 12 is first distance D1. At this moment, the microelectromechanical infrared sensing device 1 operates in the first absorbing rate mode when the reflecting plate 11 is at the first position. Then, when the controller 17 of this embodiment turns on the voltage source 16 to output the first control voltage V1 so as to control the reflecting plate 11 to move from the first position away from the substrate 10 toward the substrate 10, and after the stoppers 15 disposed on the first connecting portions A1 of the first supporting elements 13A contact the substrate 10, the reflecting plate 11 stops moving and arrives the second position. When the reflecting plate 11 is at the second position, the distance between the reflecting plate 11 and the sensing plate 12 is second distance D2. Meanwhile, the microelectromechanical infrared sensing device 1 operates in the second absorbing rate mode.

Figure 10:
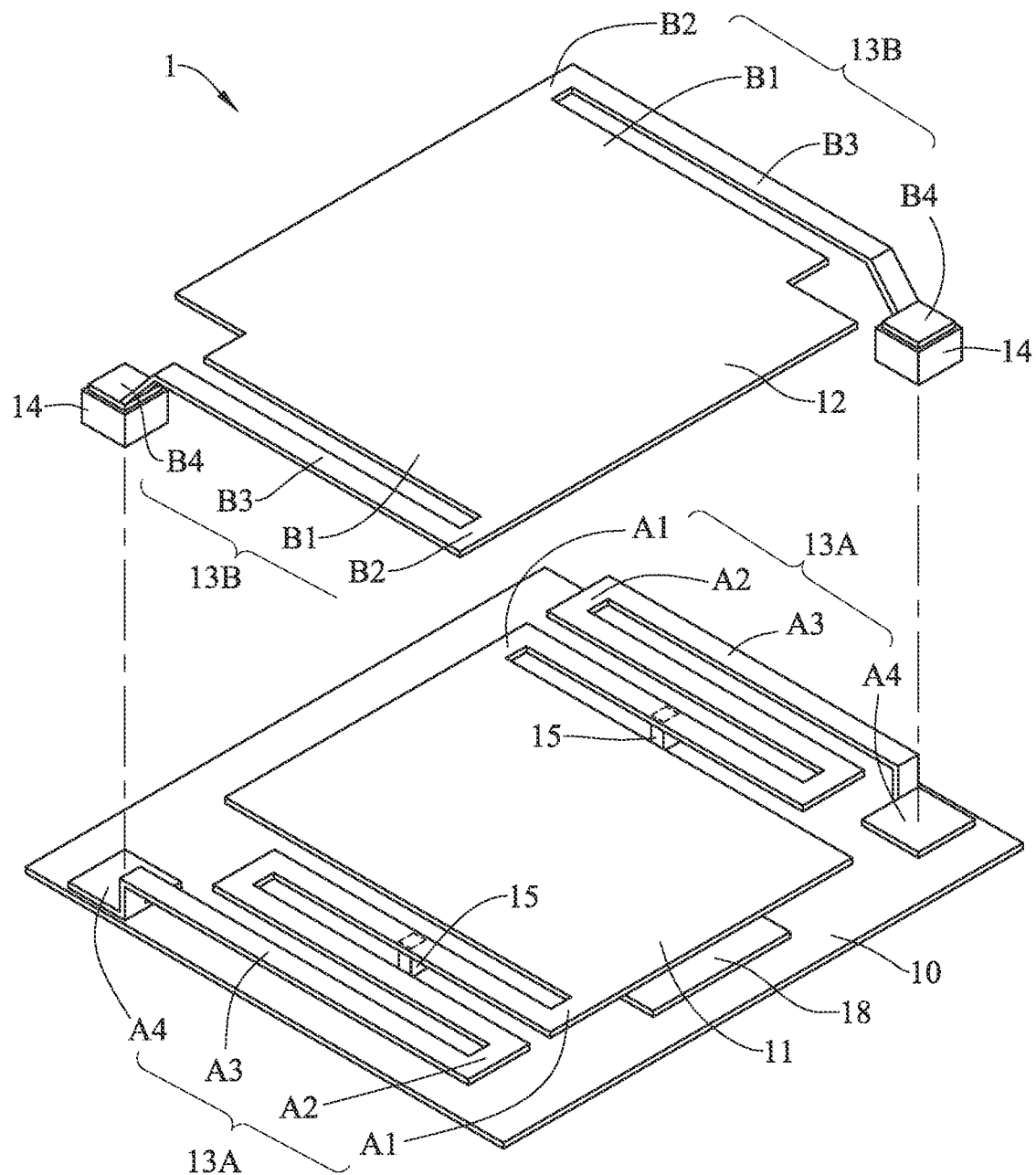
FIG. 10 is a perspective view of a microelectromechanical infrared sensing device in accordance with one embodiment of the disclosure.

Please refer to FIG. 10, which is a perspective view of a microelectromechanical infrared sensing device 1 in accordance with one embodiment of the disclosure. As shown in FIG. 10, each of the stoppers 15 of this embodiment is disposed on the center of the first connecting portion A1 of the corresponding first supporting element 13A. When the controller 17 does not turn on the voltage source 16, the reflecting plate 11 is at the first position; in this case, the distance between the reflecting plate 11 and the sensing plate 12 is first distance D1. At this moment, the microelectromechanical infrared sensing device 1 operates in the first absorbing rate mode when the reflecting plate 11 is at the first position. When the controller 17 of this embodiment turns on the voltage source 16 to output the first control voltage V1 so as to control the reflecting plate 11 to move, from the first position away from the substrate 10 toward the substrate 10, and after the stoppers 15 disposed on the first connecting portions A1 of the first supporting elements 13A contact the substrate 10, the reflecting plate 11 stops moving and arrives the second position. When the reflecting plate 11 is at the second position, the distance between the reflecting plate 11 and the sensing plate 12 is second distance D2. Meanwhile, the microelectromechanical infrared sensing device 1 operates in the second absorbing rate mode.

Figure 11:
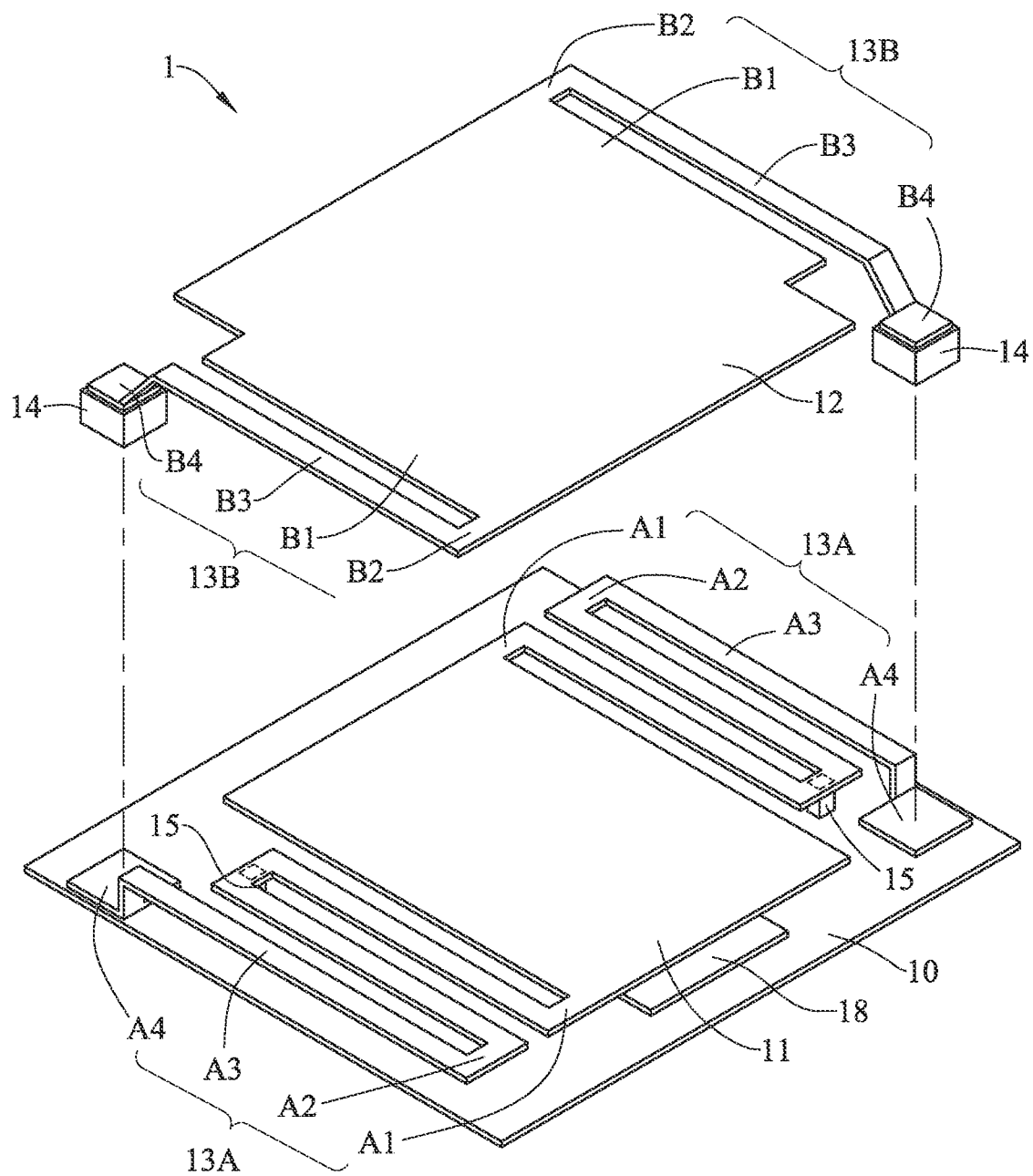
FIG. 11 is a perspective view of a microelectromechanical infrared sensing device in accordance with one embodiment of the disclosure.

Please refer to FIG. 11, which is a perspective view of a microelectromechanical infrared sensing device 1 in accordance with one embodiment of the disclosure. As shown in FIG. 11, each of the stoppers 15 of this embodiment is disposed on the first bending portion A2 of the corresponding first supporting element 13A. When the controller 17 does not turn on the voltage source 16, the reflecting plate 11 is at the first position; in this case, the distance between the reflecting plate 11 and the sensing plate 12 is first distance D1. At this moment, the microelectromechanical infrared sensing device 1 operates in the first absorbing rate mode when the reflecting plate 11 is at the first position. When the controller 17 of this embodiment turns on the voltage source 16 to output the first control voltage V1 so as to control the reflecting plate 11 to move, from the first position away from the substrate 10 toward the substrate 10, and after the stoppers 15 disposed on the first bending portions A2 of the first supporting elements 13A contact the substrate 10, the reflecting plate 11 stops moving and arrives the second position. When the reflecting plate 11 is at the second position, the distance between the reflecting plate 11 and the sensing plate 12 is second distance D2. Meanwhile, the microelectromechanical infrared sensing device 1 operates in the second absorbing rate mode.

Figure 12:
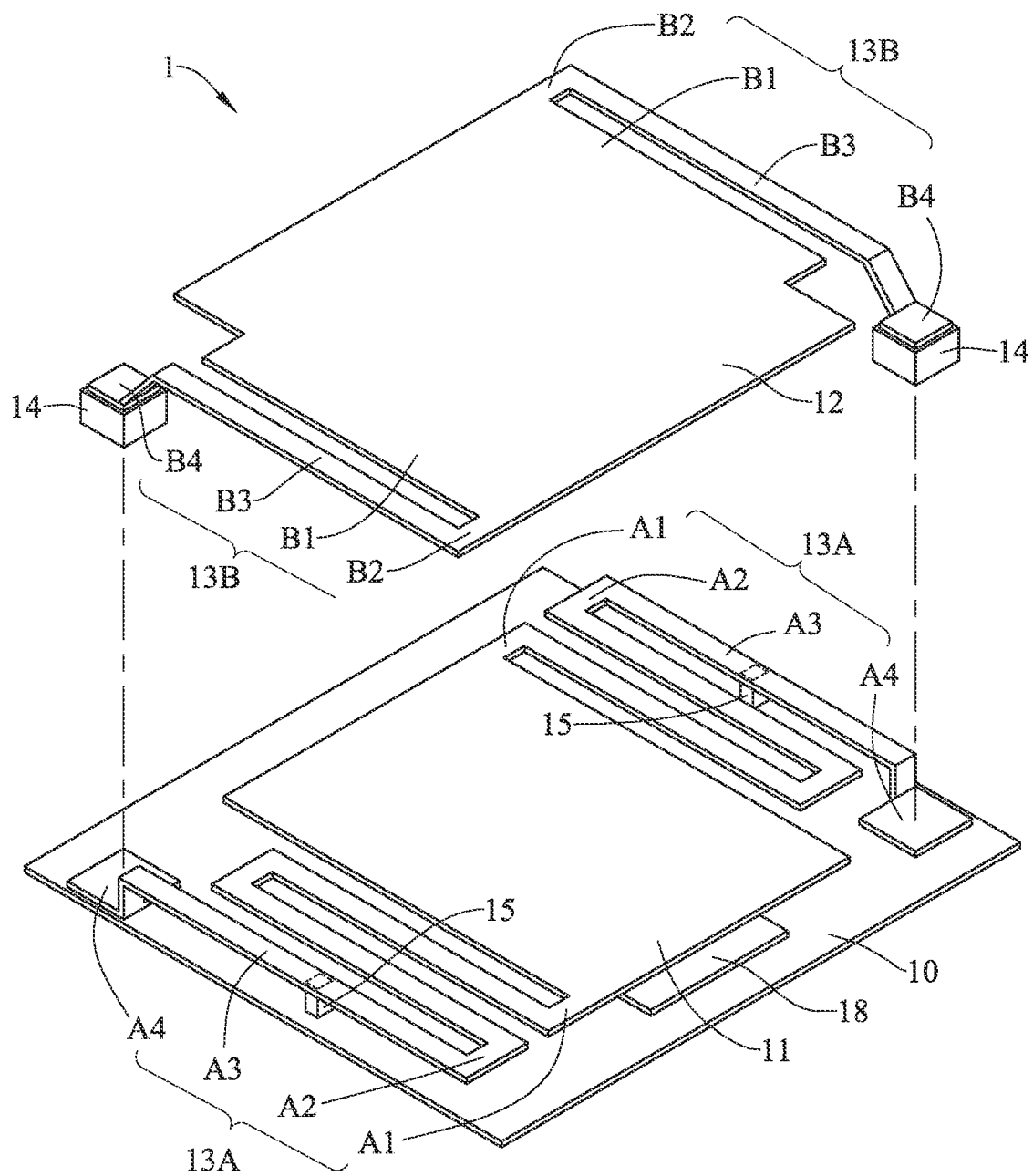
FIG. 12 is a perspective view of a microelectromechanical infrared sensing device in accordance with one embodiment of the disclosure.

Please refer to FIG. 12, which is a perspective view of a microelectromechanical infrared sensing device 1 in accordance with one embodiment of the disclosure. As shown in FIG. 12, each of the stoppers 15 of this embodiment is disposed on the center of the first supporting portion A3 of the corresponding first supporting element 13A. When the controller 17 does not turn on the voltage source 16, the reflecting plate 11 is at the first position; in this case, the distance between the reflecting plate 11 and the sensing plate 12 is first distance D1. At this moment, the microelectromechanical infrared sensing device 1 operates in the first absorbing rate mode when the reflecting plate 11 is at the first position. When the controller 17 of this embodiment turns on the voltage source 16 to output the first control voltage V1 so as to control the reflecting plate 11 to move, from the first position away from the substrate 10 toward the substrate 10, and after the stoppers 15 disposed on the first supporting portions A3 of the first supporting elements 13A contact the substrate 10, the reflecting plate 11 stops moving and arrives the second position. When the reflecting plate 11 is at the second position, the distance between the reflecting plate 11 and the sensing plate 12 is second distance D2. Meanwhile, the microelectromechanical infrared sensing device 1 operates in the second absorbing rate mode.

The embodiment just exemplifies the disclosure and is not intended to limit the scope of the disclosure. Any equivalent modification and variation according to the spirit of the disclosure is to be also included within the scope of the following claims and their equivalents.

It is worthy to point out that the currently available microelectromechanical infrared sensing devices have no effective thermal insulation structure, so these devices cannot effectively reduce the heat loss thereof. Thus, the performance and the sensing accuracy of these microelectromechanical infrared sensing devices cannot be effectively increased. In contrast, according to one embodiment of the disclosure, the reflecting plate 11 of the microelectromechanical infrared sensing device 1 is suspended above the substrate 10 and the sensing plate 12 is suspended above the reflecting plate 11, so two thermal insulation chambers (i.e. the first thermal insulation chamber H1 and the second thermal insulation chamber H2) are formed. The structure can significantly enhance the thermal insulation effect of the microelectromechanical infrared sensing device 1 and reduce the heat loss thereof. Thus, the performance and the sensing accuracy of the microelectromechanical infrared sensing device 1 can be effectively enhanced.

Also, if the temperature of the sensing target is high (i.e., the energy of the infrared light radiated by the sensing target is high), the high-resolution readout circuit would tend to be saturated when the sensing signals of the currently available conventional microelectromechanical infrared sensing device are read out. The above situation causes the microelectromechanical infrared sensing device unable to sense the sensing target of high temperature anymore, so the sensing range of the currently available microelectromechanical infrared sensing device is limited. In contrast, according to the embodiments of the disclosure, the distance between the reflecting plate 11 and the substrate 10 of the microelectromechanical infrared sensing device 1 can be adjusted via the voltage source 16, and simultaneously change the distance between the sensing plate 12 and the reflecting plate 11 in order to adjust the absorbing rate of the microelectromechanical infrared sensing device 1. Accordingly, the microelectromechanical infrared sensing device 1 can be operated in different absorbing rate modes, so can be applied to the environments with different temperatures and prevent from the saturation of the readout circuit. Thus, the sensing range of the microelectromechanical infrared sensing device 1 can be greatly increased.

Moreover, according to the embodiments of the disclosure, the sensing plate 12 of the microelectromechanical infrared sensing device 1 is a symmetrical structure. Namely, the upper infrared absorbing layer 121 and the lower infrared absorbing layer 122 of the sensing plate 12 are made of the same material, have the same thickness and symmetrically disposed on the two sides of the infrared sensing layer 123 of the sensing plate 12. This symmetrical structure can balance the stress of the sensing plate 12 when the temperature is changed so as to prevent from warpage and deformation, which can further enhance the sensing accuracy of the microelectromechanical infrared sensing device 1 and simplify the manufacturing process thereof.

Figure 13A:
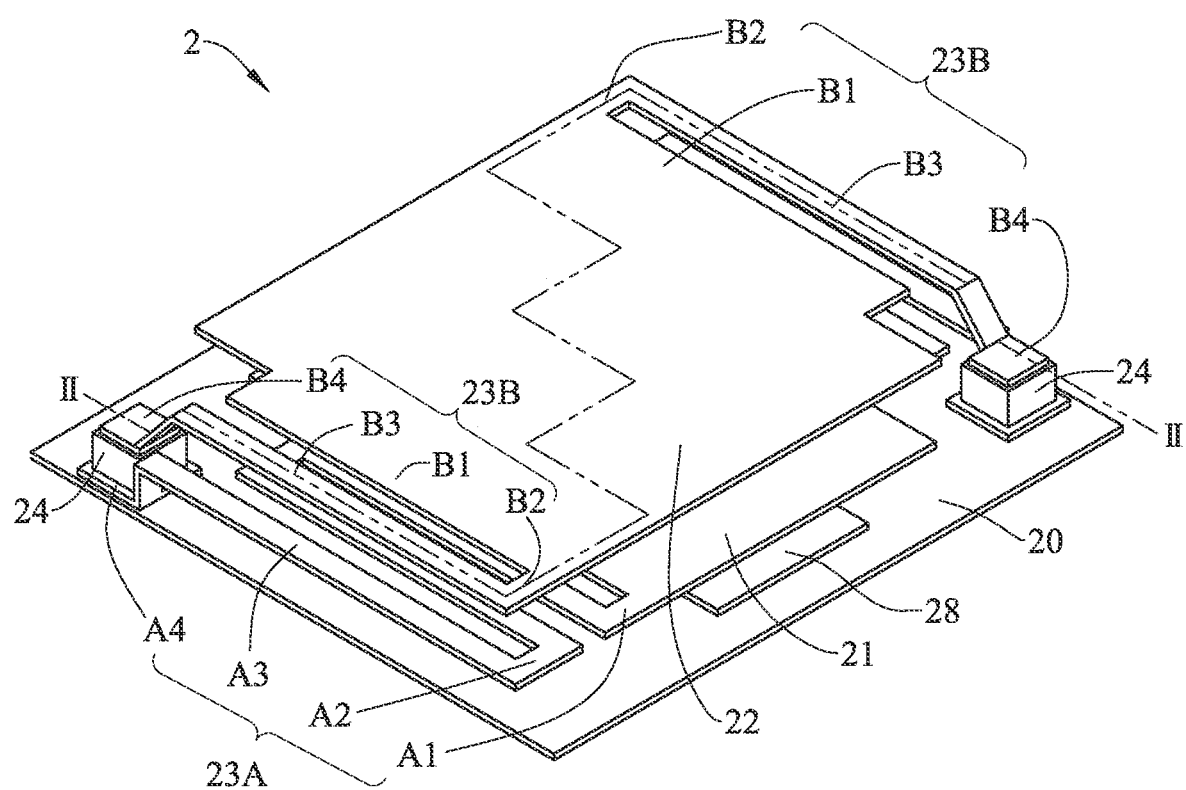
FIG. 13A~FIG. 13B are perspective views of a microelectromechanical infrared sensing device in accordance with one embodiment of the disclosure.
Figure 13B:
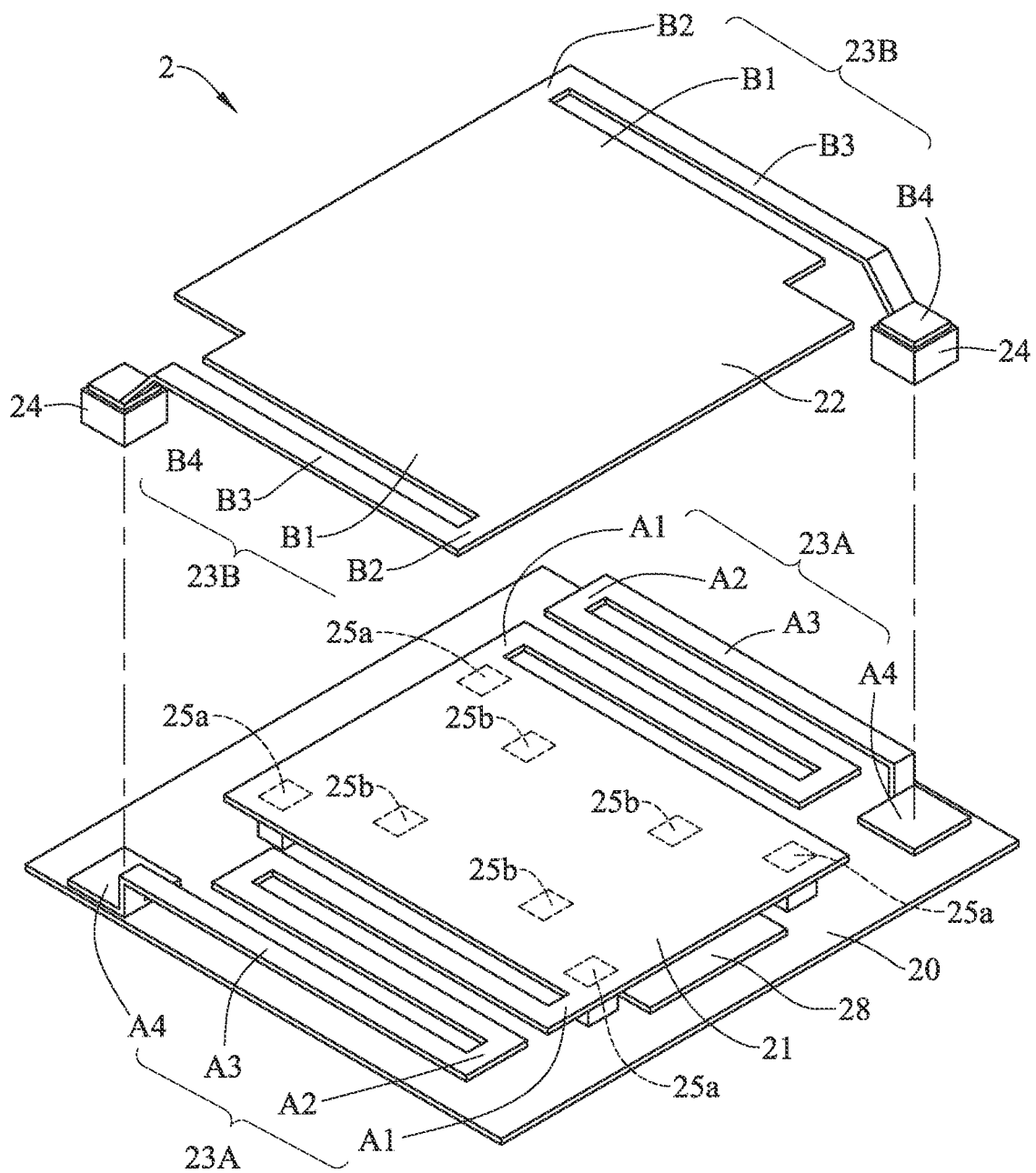
Figure 14:
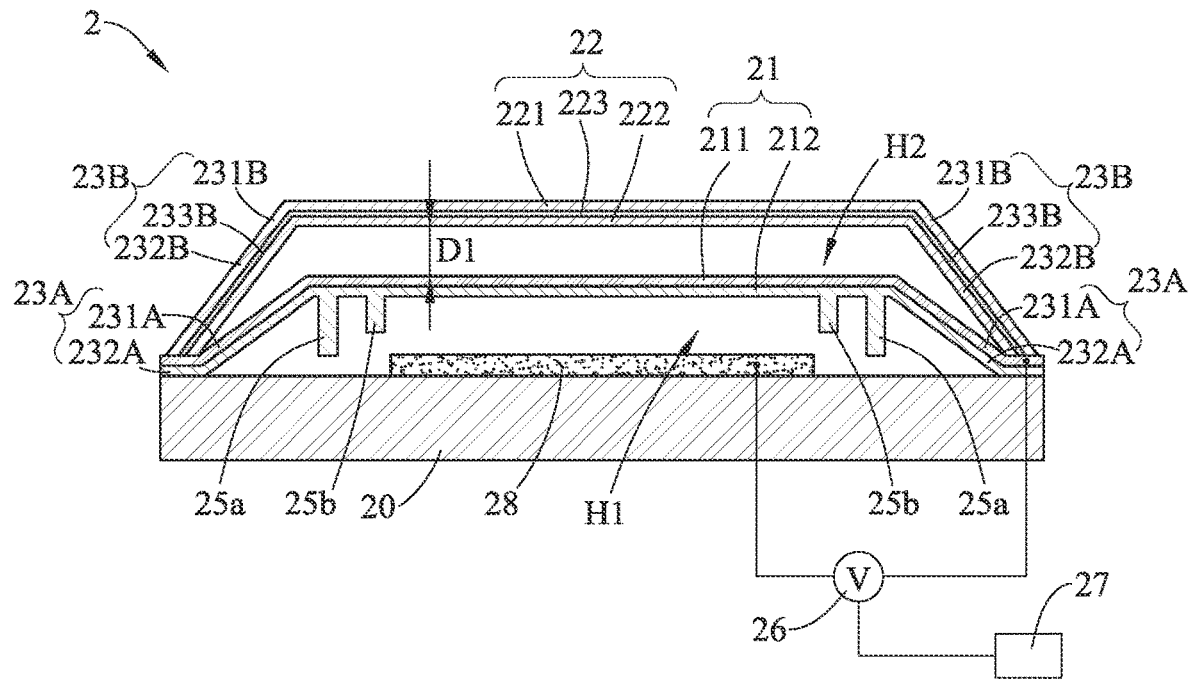
FIG. 14~FIG. 16 are cross-sectional views of the microelectromechanical infrared sensing device in accordance with one embodiment of the disclosure.

Please refer to FIG. 13A, FIG. 13B, FIG. 14, FIG. 15 and FIG. 16, which are perspective views and cross-sectional views of a microelectromechanical infrared sensing device 2 in accordance with one embodiment of the disclosure respectively. FIG. 14 is the cross-sectional view of the microelectromechanical infrared sensing device 2 along line II-II in FIG. 13A. As shown in FIG. 13A, FIG. 13B and FIG. 14, the microelectromechanical infrared sensing device 2 includes a substrate 20, a reflecting plate 21, a sensing plate 22, a plurality of first supporting elements 23A, a plurality of second supporting elements 23B, a plurality of fixation bases 24, a plurality of stoppers 25a & 25b, a voltage source 26, a controller 27 and an electrode layer 28. The reflecting plate 21 includes an infrared reflecting layer 211 and a dielectric material layer 212. Each of the first supporting elements 23A includes a first connecting portion A1, a first bending portion A2, a first supporting portion A3 and a first anchor A4, and also has the layered structure including an infrared reflecting layer 231A and a dielectric material layer 232A. The sensing plate 22 includes an upper infrared absorbing layer 221, an infrared sensing layer 223 and a lower infrared absorbing layer 222. Each of the second supporting elements 23B includes a second connecting portion B1, a second bending portion B2, a second supporting portion B3 and a second anchor B4, and also has the layered structure including an upper infrared absorbing layer 231B, an infrared sensing layer 233B and a lower infrared absorbing layer 232B. The stoppers 25a & 25b are disposed on the lower surface of the reflecting plate 21. Similarly, the reflecting plate 21 of the microelectromechanical infrared sensing device 2 is suspended above the substrate 20 and the sensing plate 22 is suspended above the reflecting plate 21. Accordingly, two thermal insulation chambers (i.e. the first thermal insulation chamber H1 and the second thermal insulation chamber H2) can be formed between the reflecting plate 21 and the substrate 20 and between the reflecting plate 21 and the sensing plate 22 respectively, which can significantly enhance the thermal insulation effect of the microelectromechanical infrared sensing device 2 and reduce the heat loss thereof.

The above elements are similar to the embodiments of FIG. 1~FIG. 12, so will not be described therein again. The difference between this embodiment and the embodiments of FIG. 1~FIG. 12 is that the stoppers include a plurality of first stoppers 25a and a plurality of second stoppers 25b. The first stoppers 25a have the same height and the second stoppers 25b have the same height. In this embodiment, the height of the first stoppers 25a is greater than the height of the second stoppers 25b. The distance between each of the first stoppers 25a and the center of the reflecting plate 21 is greater than the distance between each of the second stoppers 25b and the center of the reflecting plate 21. That is to say, the first stoppers 25a are closer to the edge of the reflecting plate 21. In another embodiment, the first stoppers 25a may also have different heights. Similarly, the second stoppers 25b may also have different heights.

The above structure enables the microelectromechanical infrared sensing device 2 to have more operating points. As shown in FIG. 14, when the controller 27 has not yet turned on the voltage source 26, the reflecting plate 21 is at the position closest to the sensing plate 22; namely, the reflecting plate 21 is at the first position shown in FIG. 14. At the moment, the distance between the reflecting plate 21 and the sensing plate 22 is first distance D1, and the microelectromechanical infrared sensing device 2 operates in a first absorbing rate mode.

Figure 15:
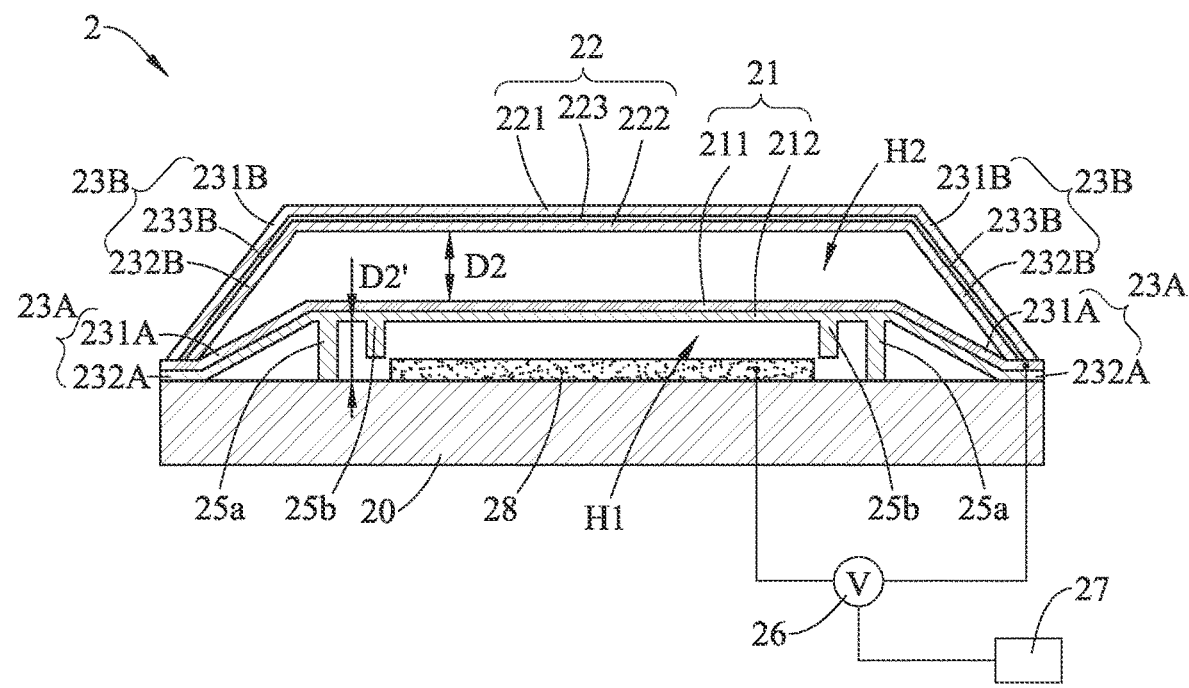

As shown in FIG. 15, when the target temperature of the microelectromechanical infrared sensing device 2 changes to be T2, the controller 27 turns on the voltage source 26 to output the first control voltage V1 so as to control the reflecting plate 21 to move, from the first position away from the substrate 20, toward the substrate 20. Then, the reflecting plate 21 stops moving and stays at the second position when the first stoppers 25a contact the substrate 20. At the moment, the distance between the reflecting plate 21 and the sensing plate 22 is second distance D2; in this case, the microelectromechanical infrared sensing device 2 operates in a second absorbing rate mode. When the reflecting plate 21 is at the second position, the first stoppers 25a are sandwiched between the substrate 20 and the reflecting plate 21, and press against the substrate 20 and the reflecting plate 21. At the moment, the distance D2' between the reflecting plate 21 and the substrate 20 is substantially equal to the height of the first stoppers 25a, such that the reflecting plate 21 can be separated from the electrode layer 28 and does not contact the electrode layer 28.

Figure 16:
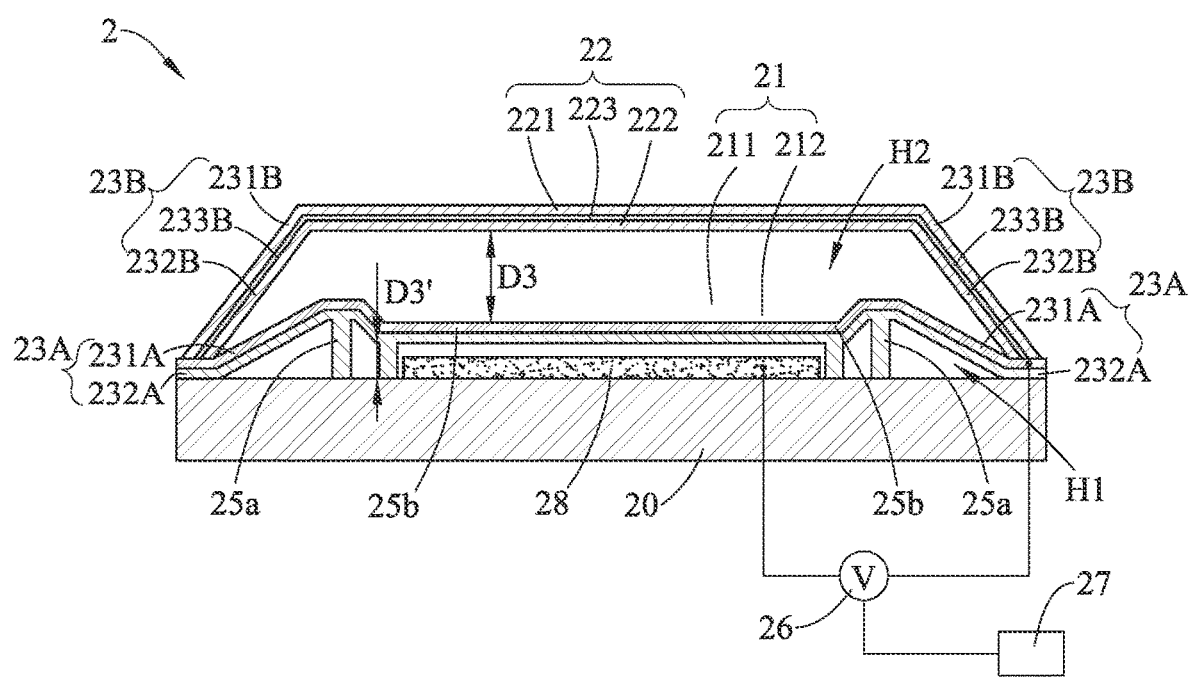

As shown in FIG. 16, when the target temperature of the microelectromechanical infrared sensing device 2 further changes to be T1, the controller 27 drives the voltage source 26 to output the second control voltage V2 (V2>V1) to control the reflecting plate 21 to further move toward the substrate 20. Then, when the second stoppers 25b contact the substrate 20, the reflecting plate 21 stops moving and stays at the third position. At the moment, the distance between the reflecting plate 21 and the sensing plate 22 is third distance D3, and the microelectromechanical infrared sensing device 2 operates in a third absorbing rate mode. When the reflecting plate 21 is at the third position, the second stoppers 25b are sandwiched between the substrate 20 and the reflecting plate 21, and press against the substrate 20 and the reflecting plate 21. At the moment, the distance D3' between the reflecting plate 21 and the substrate 20 is substantially equal to the height of the second stoppers 25b, such that the reflecting plate 21 dose not contact the electrode layer 28 directly and can be separated from the electrode layer 28

When the target temperature of the microelectromechanical infrared sensing device 2 further changes to be T3 (T3>T2>T1), the controller 27 stops driving the voltage source 26 (i.e. the voltage source 26 is turned off) so as to control the reflecting plate 21 to move in the direction away from the substrate 20 and then return back at the first position shown in FIG. 14. At the moment, the distance between the reflecting plate 21 and the sensing plate 22 is first distance D1 and the microelectromechanical infrared sensing device 2 returns to the first absorbing rate mode shown in FIG. 14.

As set forth above, the reflecting plate 21 can move between the first position, the second position and the third position. When the reflecting plate 21 is at the first position, the distance between the reflecting plate 21 and the sensing plate 22 is first distance D1. When the reflecting plate 21 is at the second position, the first stoppers 25a are sandwiched by the substrate 20 and the reflecting plate 21, and press against the substrate 20 and the reflecting plate 21. In this case, the distance between the reflecting plate 21 and the sensing plate 22 is the second distance D2, and the second distance D2 is greater than the first distance D1. When the reflecting plate 21 is at the third position, the second stoppers 25b are sandwiched by the substrate 20 and the reflecting plate 21, and press against the substrate 20 and the reflecting plate 21. In this case, the distance between the reflecting plate 21 and the sensing plate 22 is the third distance D3; the third distance D3 is greater than the second distance D2 and the second distance D2 is greater than the first distance D1. The above mechanism can adjust the absorbing rate of the sensing plate 22 with a view to prevent from the saturation of the readout circuit and can enable the microelectromechanical infrared sensing device 2 to have three operating points, which can effectively increase the sensing range of the microelectromechanical infrared sensing device 2. The microelectromechanical infrared sensing device 2 can have more stoppers with different heights, such that the microelectromechanical infrared sensing device 2 can have more operating points so as to satisfy different measurement requirements.

On the other hand, the microelectromechanical infrared sensing device 2 can perform calculation via an algorithm according to the target temperature and the operating points with a view to obtain the best distance between the reflecting plate 21 and the sensing plate 22 and then adjust the reflecting plate 21 according to the calculation result. In this way, the sensing plate 22 can absorb more thermal energy without incurring the saturation of the readout circuit.

The embodiment just exemplifies the disclosure and is not intended to limit the scope of the disclosure. Any equivalent modification and variation according to the spirit of the disclosure is to be also included within the scope of the following claims and their equivalents.

Figure 17A:
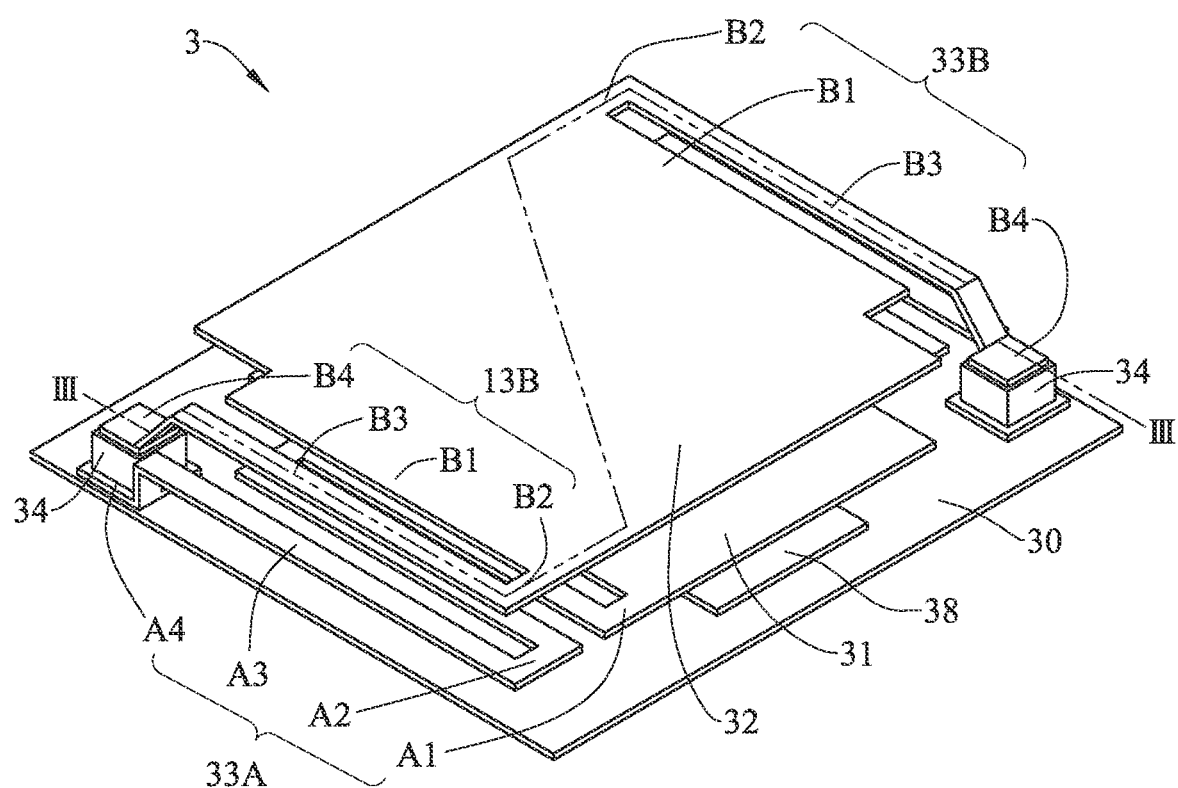
FIG. 17A~FIG. 17B are perspective views of a microelectromechanical infrared sensing device in accordance with one embodiment of the disclosure.
Figure 17B:
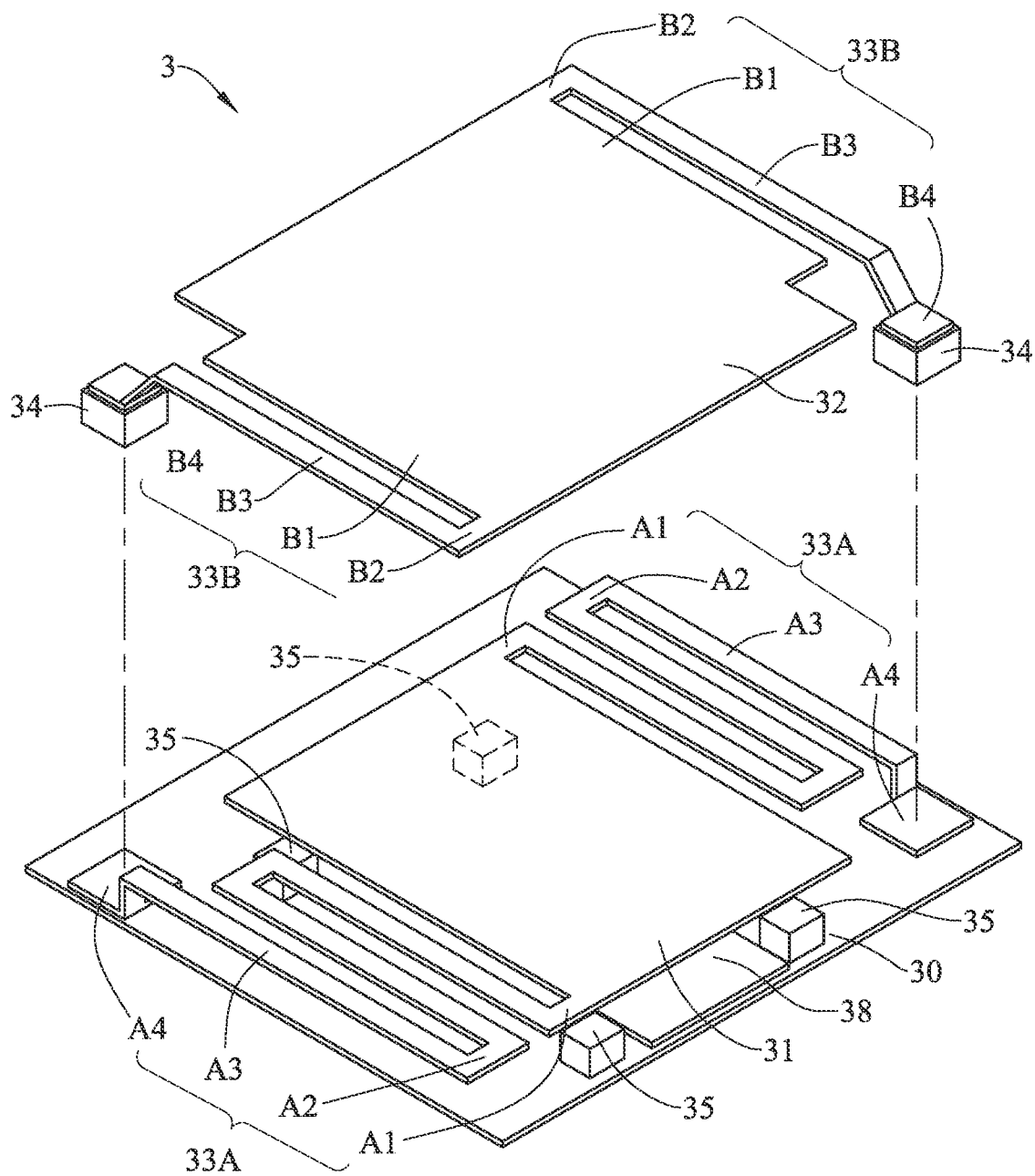
Figure 18:
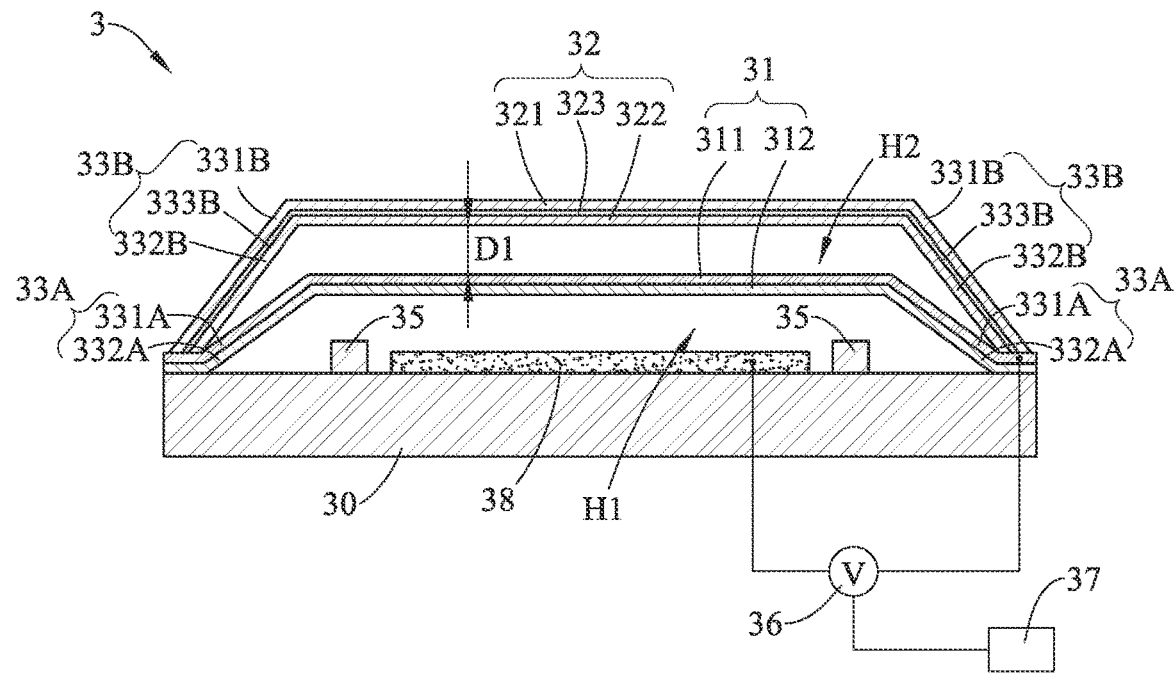
FIG. 18~FIG. 19 are cross-sectional views of the microelectromechanical infrared sensing device in accordance with one embodiment of the disclosure.

Please refer to FIG. 17A, FIG. 17B, FIG. 18 and FIG. 19, which are perspective views and cross-sectional views of a microelectromechanical infrared sensing device 3 in accordance with one embodiment of the disclosure respectively. FIG. 18 is the cross-sectional view of the microelectromechanical infrared sensing device 3 along line III-III in FIG. 17A. As shown in FIG. 17A, FIG. 17B and FIG. 18, the microelectromechanical infrared sensing device 3 includes a substrate 30, a reflecting plate 31, a sensing plate 32, a plurality of first supporting elements 33A, a plurality of second supporting elements 33B, a plurality of fixation bases 34, a plurality of stoppers 35, a voltage source 36, a controller 37 and an electrode layer 38. The electrode layer 38 is disposed on the substrate 30. The reflecting plate 31 includes an infrared reflecting layer 311 and a dielectric material layer 312. Each of the first supporting elements 33A includes a first connecting portion A1, a first bending portion A2, a first supporting portion A3 and a first anchor A4, and also has the layered structure including an infrared reflecting layer 331A and a dielectric material layer 332A. The sensing plate 32 includes an upper infrared absorbing layer 321, an infrared sensing layer 323 and a lower infrared absorbing layer 322. Each of the second supporting elements 33B includes a second connecting portion B1, a second bending portion B2, a second supporting portion B3 and a second anchor B4, and also has the layered structure including an upper infrared absorbing layer 331B, an infrared sensing layer 333B and a lower infrared absorbing layer 332B. Similarly, the reflecting plate 31 of the microelectromechanical infrared sensing device 3 is suspended above the substrate 30 and the sensing plate 32 is suspended above the reflecting plate 31. Accordingly, two thermal insulation chambers (i.e. the first thermal insulation chamber H1 and the second thermal insulation chamber H2) can be formed between the reflecting plate 31 and the substrate 30 and between the reflecting plate 31 and the sensing plate 32 respectively, which can significantly enhance the thermal insulation effect of the microelectromechanical infrared sensing device 3 and reduce the heat loss thereof.

The above elements are similar to the embodiments of FIG. 1~FIG. 12, so will not be described therein again. The difference between this embodiment and the embodiments of FIG. 1~FIG. 12 is that the stoppers 35 are disposed on the substrate 30, and the stoppers 35 and the substrate 30 may be made of the same material. The above structure enables the microelectromechanical infrared sensing device 3 to achieve similar functions of the embodiments of FIG. 1~FIG. 12.

As shown in FIG. 18, when the controller 37 does not turn on the voltage source 36, the reflecting plate 31 is at the position closest to the sensing plate 32. At the moment, the reflecting plate 31 is at a first position, as shown in FIG. 18. When the reflecting plate 31 is at the first position, the distance between the reflecting plate 31 and the sensing plate 32 is first distance D1, and the microelectromechanical infrared sensing device 3 operates in a first absorbing rate mode.

Figure 19:
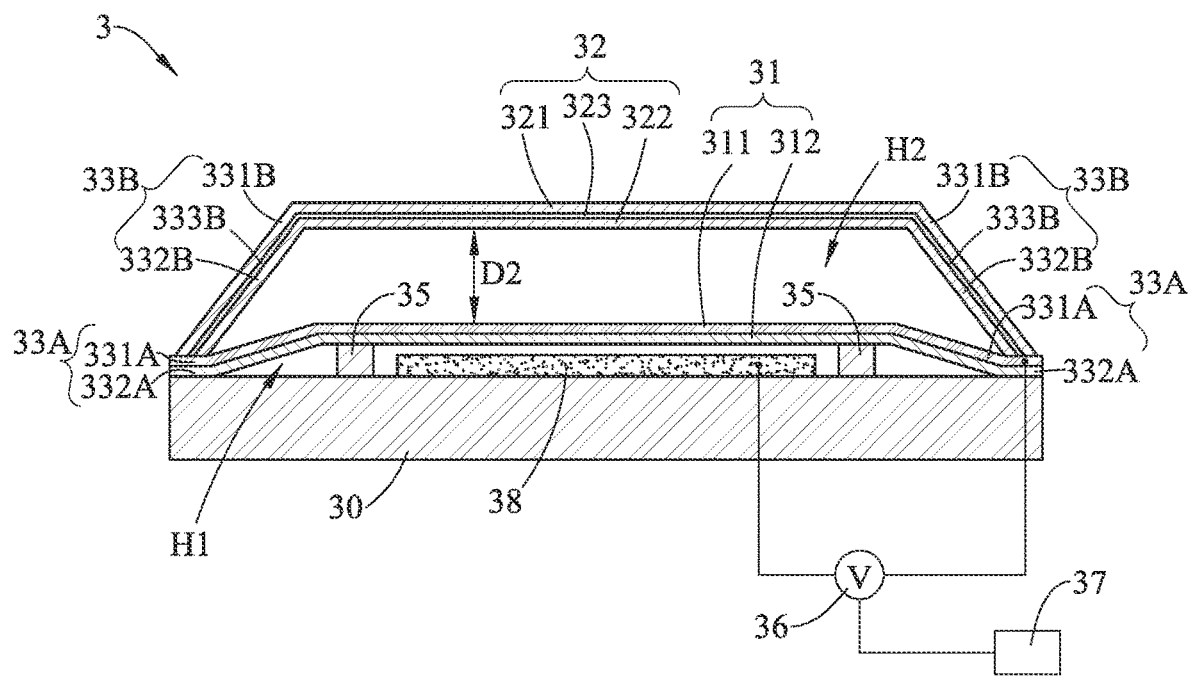

As shown in FIG. 19, when the target temperature of the microelectromechanical infrared sensing device 3 changes to be T1, the controller 37 turns on the voltage source 36 to generate a first control voltage V1 so as to control the reflecting plate 31 to move, from the first position away from the substrate 30, toward the substrate 30. When the stoppers 35 contact the substrate 30, the reflecting plate 31 stops moving and stays at a second position, as shown in FIG. 19. In this case, the distance between the reflecting plate 31 and the sensing plate 32 is second distance D2 and the microelectromechanical infrared sensing device 3 operates in a second absorbing rate mode. When the reflecting plate 31 is at the second position, the stoppers 35 are sandwiched between the substrate 30 and the reflecting plate 31, and press against the substrate 30 and the reflecting plate 31. At the moment, the distance between the reflecting plate 31 and the substrate 30 is substantially equal to the height of the stoppers 35, such that the reflecting plate 31 can be separated from the electrode layer 38 and does not contact the electrode layer 38. In this case, the sensing plate 32 is furthest away from the reflecting plate 31 (the infrared reflecting layer 311).

When the target temperature of the microelectromechanical infrared sensing device 3 changes to be T2 (T2>T1), the controller 37 stops driving the voltage source 36 (i.e. the voltage source 36 is turned off) so as to control the reflecting plate 31 to move in the direction away from the substrate 30 and then return back at the first position shown in FIG. 18. At the moment, the distance between the reflecting plate 31 and the sensing plate 12 is first distance D1 and the microelectromechanical infrared sensing device 3 returns to the first absorbing rate mode. The above mechanism can prevent from the saturation of the readout circuit, so the sensing accuracy of the microelectromechanical infrared sensing device 3 can be improved and the sensing range of the microelectromechanical infrared sensing device 3 can be also increased.

The embodiment just exemplifies the disclosure and is not intended to limit the scope of the disclosure. Any equivalent modification and variation according to the spirit of the disclosure is to be also included within the scope of the following claims and their equivalents.

To sum up, according to the embodiments of the disclosure, the reflecting plate of the microelectromechanical infrared sensing device is suspended above the substrate and the sensing plate is suspended above the reflecting plate, so two thermal insulation chambers are formed. The structure can significantly enhance the thermal insulation effect of the microelectromechanical infrared sensing device and reduce the heat loss thereof. Thus, the performance and the sensing accuracy of the microelectromechanical infrared sensing device can be effectively enhanced.

According to the embodiments of the disclosure, the distance between the reflecting plate and the substrate of the microelectromechanical infrared sensing device can be adjusted via the voltage source, and simultaneously change the distance between the sensing plate and the reflecting plate in order to adjust the absorbing rate of the microelectromechanical infrared sensing device. Accordingly, the microelectromechanical infrared sensing device can be operated in different absorbing rate modes, so can be applied to the environments with different temperatures and prevent from the saturation of the readout circuit. Thus, the sensing range of the microelectromechanical infrared sensing device can be greatly increased.

Moreover, according to the embodiments of the disclosure, the microelectromechanical infrared sensing device has one or more stoppers having different heights (e.g. the first stoppers and the second stoppers). Therefore, the microelectromechanical infrared sensing device is adjustable and has several operating points, which further increases the sensing rage of the microelectromechanical infrared sensing device.

Furthermore, according to the embodiments of the disclosure, the sensing plate of the microelectromechanical infrared sensing device has a symmetrical structure, which can balance the over stress of the sensing plate so as to prevent from warpage and deformation. Therefore, the distance between the sensing plate and the reflecting plate can be precisely controlled, which can further enhance the sensing accuracy of the microelectromechanical infrared sensing device and simplify the manufacturing process thereof.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A microelectromechanical infrared sensing device, comprising:
   a substrate;
   a sensing plate;
   a plurality of second supporting elements, connected to the sensing plate, whereby the sensing plate is suspended above the substrate;
   a reflecting plate, disposed between the substrate and the sensing plate;
   a plurality of first supporting elements, connected to the reflecting plate, whereby the reflecting plate is suspended between the substrate and the sensing plate; and
   a plurality of stoppers, disposed between the substrate and the reflecting plate;
   wherein when the reflecting plate moves toward the substrate and at least one of the stoppers contacts the substrate or the reflecting plate, a distance between the reflecting plate and the sensing plate increases.

2. The microelectromechanical infrared sensing device of claim 1, further comprising an electrode layer disposed on the substrate and a voltage source connected to the reflecting plate and the electrode layer, wherein the voltage source generates a voltage difference between the reflecting plate and the electrode layer so as to control the reflecting plate to move.

3. The microelectromechanical infrared sensing device of claim 2, further comprising an insulation layer covering the electrode layer.

4. The microelectromechanical infrared sensing device of claim 1, wherein the reflecting plate is able to move between a first position relatively far from the substrate and a second position relatively near the substrate, wherein:
   when the reflecting plate is at the first position, the distance between the reflecting plate and the sensing plate is a first distance; and
   when the reflecting plate is at the second position, at least one of the stoppers is sandwiched by the substrate and the reflecting plate and presses against the substrate and the reflecting plate, and the distance between the reflecting plate and the sensing plate is a second distance;
   wherein the second distance is greater than the first distance.

5. The microelectromechanical infrared sensing device of claim 4, wherein when the reflecting plate is at the second position, the distance between the substrate and the reflecting plate is substantially equal to a height of at least one of the stoppers.

6. The microelectromechanical infrared sensing device of claim 4, wherein the stoppers comprises a plurality of first stoppers and a plurality of second stoppers, and the reflecting plate is able to move among the first position, the second position and a third position, wherein:
   when the reflecting plate is at the second position, the first stoppers are sandwiched between the substrate and the reflecting plate and press against the substrate and the reflecting plate; and
   when the reflecting plate is at the third position, the second stoppers are sandwiched between the substrate and the reflecting plate and press against the substrate and the reflecting plate, and the distance between the reflecting plate and the sensing plate is a third distance;
   wherein the third distance is greater than the second distance.

7. The microelectromechanical infrared sensing device of claim 6, wherein the first stoppers are connected to at least one of the first supporting elements, and the second stoppers are connected to the reflecting plate, wherein a height of at least one of the first stoppers is greater than a height of at least one of the second stoppers.

8. The microelectromechanical infrared sensing device of claim 6, wherein a distance between the first stoppers and a center of the reflecting plate is greater than a distance between the second stoppers and the center of the reflecting plate.

9. The microelectromechanical infrared sensing device of claim 1, wherein the stoppers are disposed on the reflecting plate, the substrate or the first supporting elements.

10. The microelectromechanical infrared sensing device of claim 9, wherein line segments connecting each of the two adjacent the stoppers with each other form a polygon, and the polygon is axial-symmetrical or central-symmetrical.

11. The microelectromechanical infrared sensing device of claim 1, wherein the sensing plate comprises an upper infrared absorbing layer and an infrared sensing layer, and the infrared sensing layer comprises a lower surface facing the substrate and an upper surface opposite to the lower surface, wherein the upper infrared absorbing layer is disposed on the upper surface of the infrared sensing layer.

12. The microelectromechanical infrared sensing device of claim 11, wherein the sensing plate further comprises a lower infrared absorbing layer disposed on the lower surface of the infrared sensing layer.

13. The microelectromechanical infrared sensing device of claim 12, wherein the upper infrared absorbing layer and the lower infrared absorbing layer are made of a same material.

14. The microelectromechanical infrared sensing device of claim 12, wherein a thickness of the upper infrared absorbing layer is substantially equal to a thickness of the lower infrared absorbing layer.

15. The microelectromechanical infrared sensing device of claim 1, wherein the reflecting plate comprises an infrared reflecting layer and a dielectric material layer, wherein the infrared reflecting layer comprises a lower surface facing the substrate and the dielectric material layer is disposed on the lower surface of the infrared reflecting layer.

16. The microelectromechanical infrared sensing device of claim 1, wherein each of the first supporting elements comprises an infrared reflecting layer and a dielectric material layer, wherein the infrared reflecting layer of each of the first supporting elements comprises a lower surface adjacent to the substrate, and the dielectric material layer of each of the first supporting elements is disposed on the lower surface of the infrared reflecting layer thereof.

17. The microelectromechanical infrared sensing device of claim 1, wherein a stiffness of the first supporting elements in a direction of a normal vector of the substrate is less than a stiffness of the reflecting plate in the direction of the normal vector of the substrate.

18. The microelectromechanical infrared sensing device of claim 1, wherein each of the second supporting elements further comprises a lower infrared absorbing layer adjacent to the substrate, an infrared sensing layer and an upper infrared absorbing layer, wherein the infrared sensing layer of each of the second supporting elements is disposed between the upper infrared absorbing layer and the lower infrared absorbing layer thereof.

19. The microelectromechanical infrared sensing device of claim 1, further comprises a fixation base, wherein:
   one end of each of the first supporting elements is provided with a first anchor fixed on the substrate, and the fixation base is fixed on the first anchor of the first supporting element; and
   one end of each of the second supporting element is provided with a second anchor, and the second anchor is fixed on the fixation base.

* * * * *